United States Patent [19]

Ohtsuki

[11] Patent Number: 5,668,759

[45] Date of Patent: Sep. 16, 1997

[54] METHOD FOR ERASING AND VERIFYING NONVOLATILE SEMICONDUCTOR MEMORY

[75] Inventor: Tetsuya Ohtsuki, Tokyo, Japan

[73] Assignee: NEC Corporation, Tokyo, Japan

[21] Appl. No.: 419,897

[22] Filed: Apr. 11, 1995

[30] Foreign Application Priority Data

Apr. 11, 1994 [JP] Japan .................................. 6-071716

[51] Int. Cl.$^6$ .......................................... G11C 11/34
[52] U.S. Cl. ............................. 365/185.29; 365/185.22; 365/185.3
[58] Field of Search ..................... 365/185.22, 185.29, 365/185.3, 185.33, 185.14, 218

[56] References Cited

U.S. PATENT DOCUMENTS

| 5,293,560 | 3/1994 | Harari | 365/185.3 |
| 5,483,485 | 1/1996 | Maruyama | 365/185.29 |

FOREIGN PATENT DOCUMENTS

| 0501 289 A2 | 2/1992 | European Pat. Off. . |
| 0596 198 A2 | 11/1994 | European Pat. Off. . |

OTHER PUBLICATIONS

Seki et al., "Non–Volatile And Fast Static Memories", *IEEE International Solid–State Circuits Conference*, pp. 60–61, Feb. 14, 1990.

Yamada et al., "A Self–Convergence Erasing Scheme For A Simple Stacked Gate Flash Eeprom", *IEDM*.

Oyama et al., "A Novel Erasing Technology For 3.3V Flash Memory With 64Mb Capacity And Beyond", *IEDM Technical Digest*, pp. 607–610, (1982).

*Primary Examiner*—David C. Nelms
*Assistant Examiner*—F. Niranjan
*Attorney, Agent, or Firm*—Foley & Lardner

[57] ABSTRACT

In a nonvolatile semiconductor memory device including memory cells, a predetermined number of the memory cells are simultaneously erased. Only when at least one of the memory cells is overerased, i.e., is in a depletion state, a threshold voltage recovering operation is performed upon all of the memory cells, to relieve the overerased memory cell and suppress the deviation of threshold voltage.

36 Claims, 34 Drawing Sheets

P-CHANNEL ENHANCEMENT TYPE TRANSISTOR

N-CHANNEL ENHANCEMENT TYPE TRANSISTOR

WRITE MODE

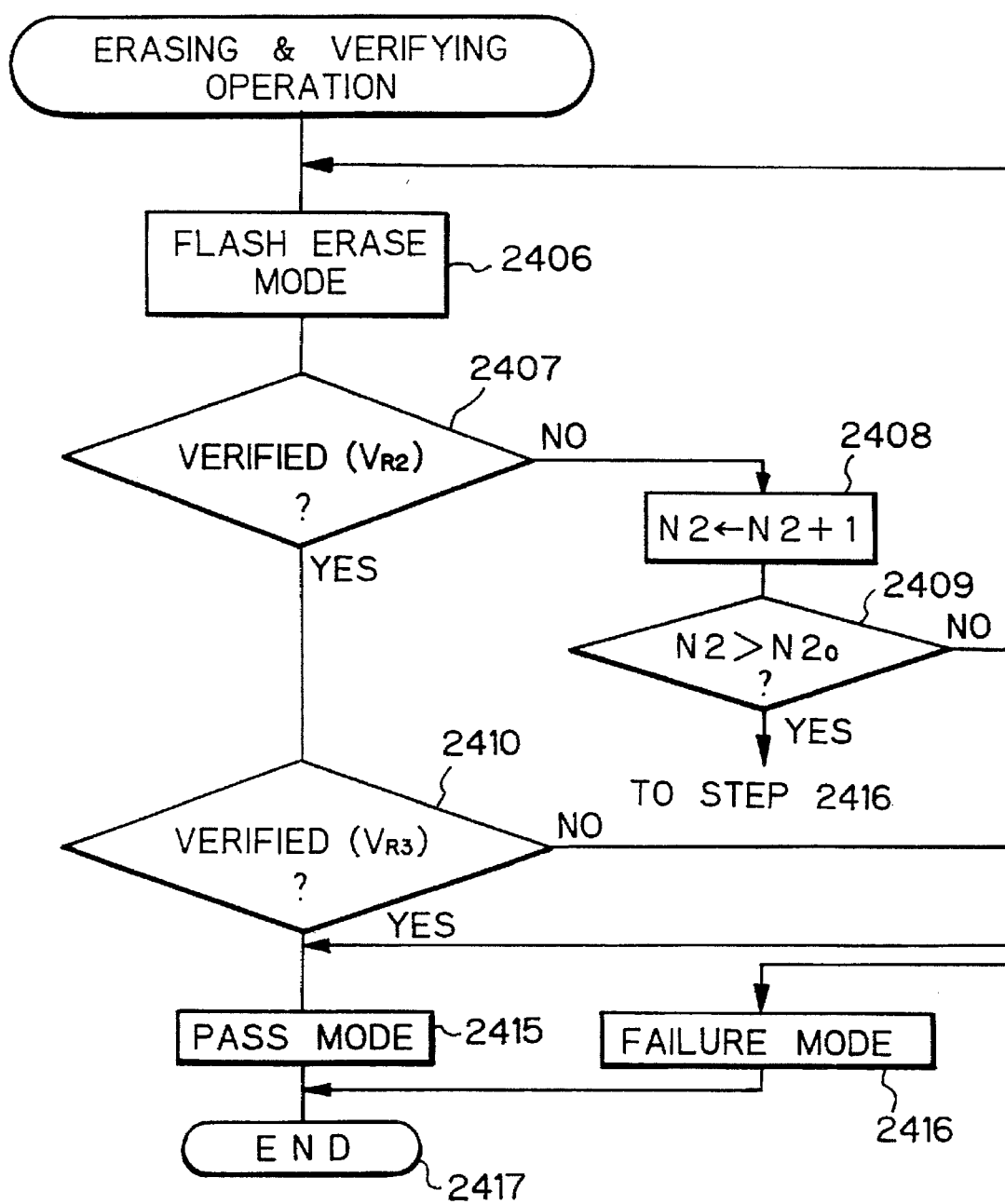

METHOD FOR ERASING AND VERIFYING NONVOLATILE SEMICONDUCTOR MEMORY

BACKGROUND OF THE INVENTION

1. Field of the Invention

The present invention relates to a method for erasing and verifying a nonvolatile semiconductor memory device.

2. Description of the Related Art

In a nonvolatile semiconductor memory device, an electrical write operation can be carried out after the device is mounted on a printed circuit board. One typical example of such a device is a flash memory device which has an advantage in that data storage is possible without a backup battery, and which is highly integrated.

In a first prior art erasing and verifying method for a flash memory device, in order to suppress the deviation of threshold voltage after a flash erase operation, a write operation is performed upon memory cells before the erase operation. This will be explained later in detail.

In the first prior art erasing and verifying method, however, when some of the memory cells are overerased, i.e., enter a depletion state, it is impossible to compensate for this overerasing. Note that the depletion state memory cells invite a malfunction of write/read operation.

In a second prior art erasing and verifying method, a flash overerase operation after a flash erase operation is performed upon all of the memory cells, so that all of the memory cells are of a depletion type. Then, a threshold voltage recovering operation, which is a kind of write operation, is performed upon the memory cells, to suppress the deviation of threshold voltage as well as avoid the generation of depletion state memory cells (see: K. Oyama et al., "A Novel Erasing Technology for 3.3 V Flash Memory with 64 Mb Capacity and Beyond", IEDM Technical Digest, 1992, pp. 607–610; and S. Yamada et al., "A SELF-CONVERGENCE ERASING SCHEME FOR A SIMPLE STACKED GATE FLASH MEMORY", IEDM Technical Digest, 1991 pp. 307–310). This will be explained later in detail.

In the second prior art erasing and verifying method, however, in spite of the enhancement/depletion state of the memory cells, a flash overerase operation for putting the memory cells in a depletion state and a threshold voltage recovering operation are carried out, to increase the time required for erasing and verifying the flash memory device.

SUMMARY OF THE INVENTION

It is, therefore, an object of the present invention to reduce the time required for an erasing and verifying operation in a nonvolatile semiconductor memory device as well as to relieve depletion state memory cells thereof.

According to the present invention, in a nonvolatile semiconductor memory device including memory cells, a predetermined number of the memory cells are simultaneously erased. Only when at least one of the memory cells is overerased, i.e., is in a depletion state, is a threshold voltage recovering operation performed upon all of the memory cells, to relieve the overerased memory cell and suppress the deviation of threshold voltage. In other words, when none of the memory cells are overerased, the threshold voltage recovering operation is not carried out.

BRIEF DESCRIPTION OF THE DRAWINGS

The present invention will be more clearly understood from the description as set forth below, as compared with the prior art, with reference to the accompanying drawings, wherein:

FIGS. 28A and 28B are flowcharts showing the operation of the control circuit of FIG. 19 for carrying out a fifth embodiment of the erasing and verifying method according to the present invention.

DESCRIPTION OF THE PREFERRED EMBODIMENTS

Before the description of the preferred embodiments, prior art erasing and verifying methods will be explained with reference to FIG. 1, 2A, 2B, 2C, 3 through 10, 11A, 11B, 12, 13, 14, 15, 16A, 16B, 17, 18A, 18B, 19, 20A, 20B, 21, 22, 23A and 23B.

Figure 1:
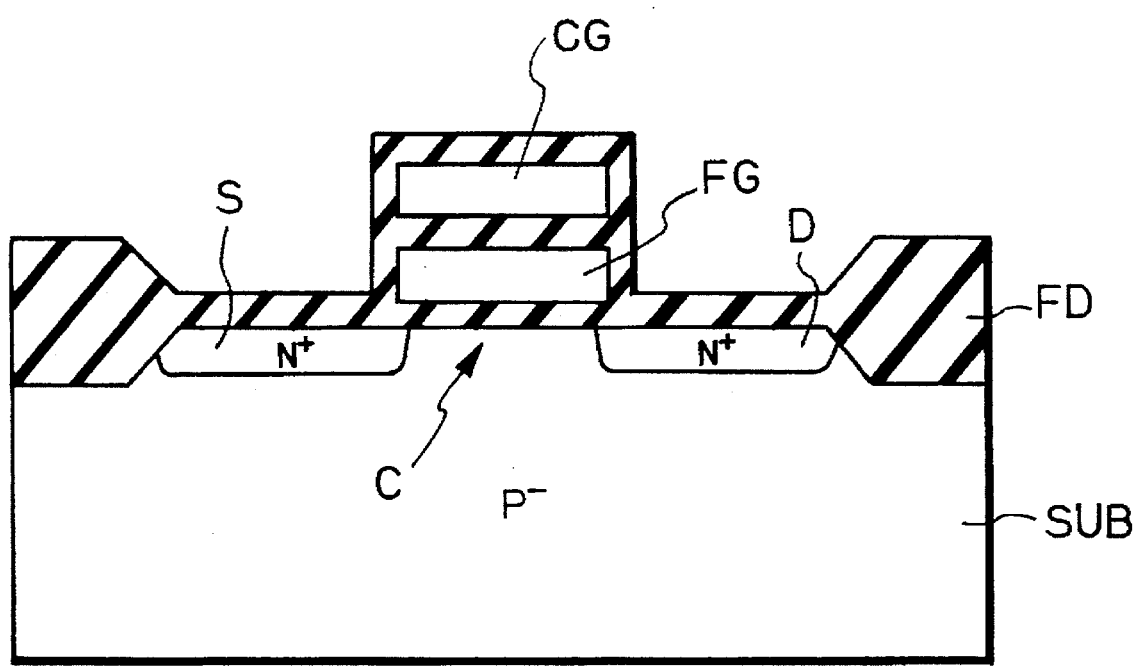
FIG. 1 is a cross-sectional view illustrating an example of nonvolatile memory cell.

In FIG. 1, which illustrates an example of a nonvolatile memory cell, an $N^+$-type source region S and an $N^+$-type drain region D are formed within a $P^-$-type monocrystalline silicon substrate SUB surrounded by a thick field oxide layer FD. Also, a floating gate FG and a control gate CG are formed over a channel region C between the source region S and the drain region D. The floating gate FG and the control gate CG are electrically isolated from each other by silicon oxide layers. Particularly, a tunnel silicon oxide layer between the floating gate FG and the substrate SUB is made thin, for example, is about 60 to 200 ÅA, to invite the Fowler-Nordheim tunnelling effect therein.

Figure 2A:
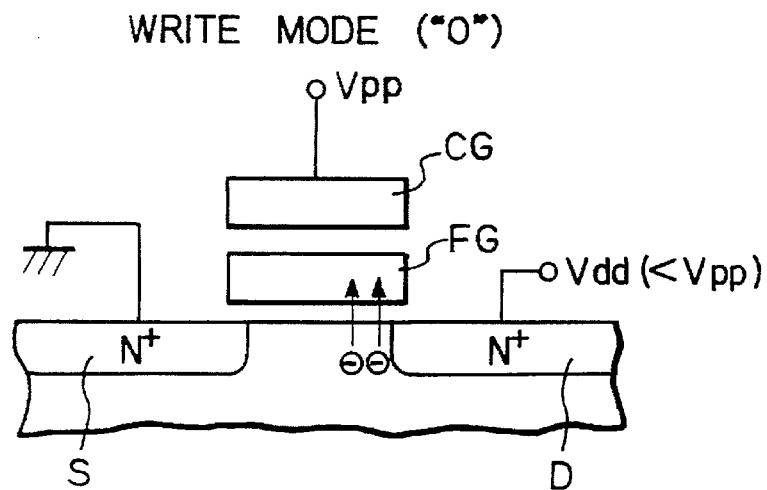
FIGS. 2A, 2B and 2C, are cross-sectional views showing the operation of the nonvolatile memory cell of FIG. 1.

A write operation upon the memory cell of FIG. 1 is carried out as shown in FIG. 2A. That is, a high voltage $V_{PP}$ which is, for example, 6 to 12 V, is applied to the control gate CG and a high voltage $V_{dd}$ ($<V_{PP}$) is applied to the drain region D, while the source region S is grounded. As a result, hot electrons are generated by the impact ionization in the vicinity of the drain region D, and accordingly, the hot electrons having energy larger than an energy barrier of the tunnel silicon oxide layer are introduced into the floating gate FG. Thus, the threshold voltage of the memory cell is increased. This state corresponds to data "0".

Figure 2B:
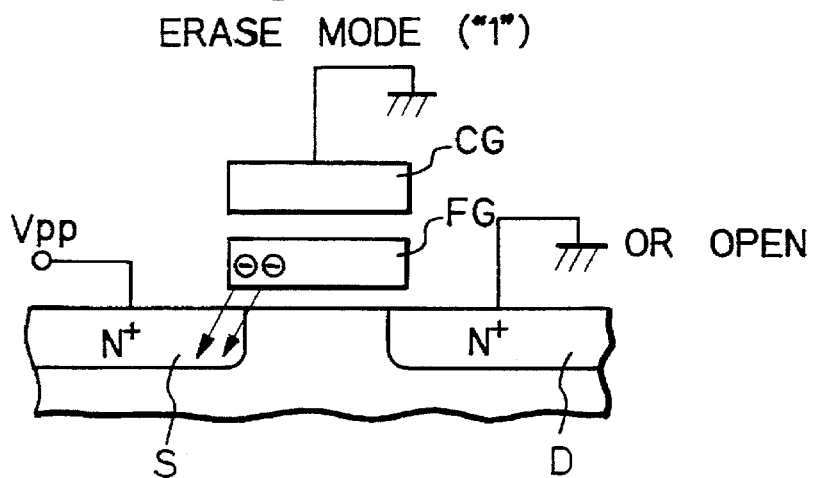

An erase operation upon the memory cell of FIG. 1 is carried out as shown in FIG. 2B. That is, the high voltage $V_{PP}$ is applied to the source region S, while the control gate CG and the drain region D are grounded. In this case, the drain region D can be open. As a result, the electrons stored in the floating gate FG are extracted therefrom to the source region S utilizing the Fowler-Nordheim tunnelling effect. Thus, the threshold voltage of the memory cell is decreased. This state corresponds to data "1".

Figure 2C:
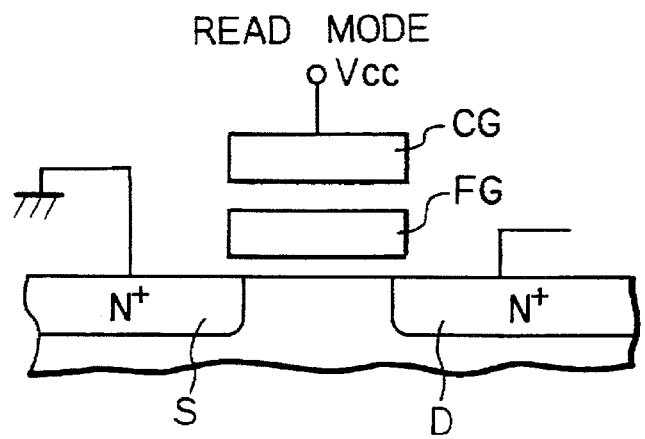

A read operation upon the memory cell of FIG. 1 is carried out as shown in FIG. 2C. That is, a voltage $V_{cc}$, which is, for example, about 5 V, is applied to the control gate CG, while the source region S is grounded. As a result, the voltage at the drain region D is changed in accordance with the electrons stored in the floating gate FG, this carrying out a read operation.

Figure 3:
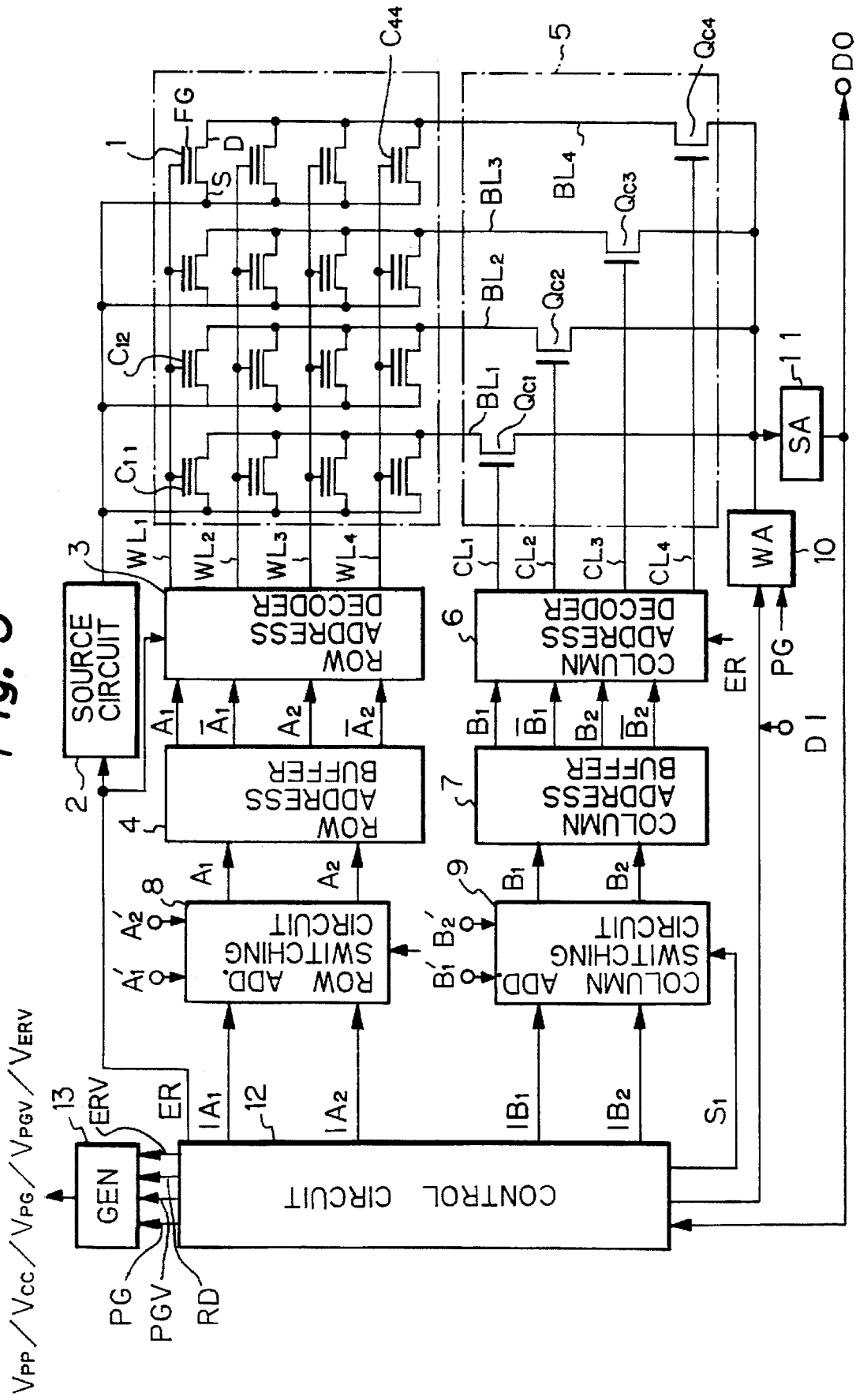
FIG. 3 is a block circuit diagram illustrating a nonvolatile semiconductor memory device to which a first prior art erasing and verifying method is applied.

In FIG. 3, which is a block circuit diagram illustrating a nonvolatile semiconductor device to which a first prior art erasing and verifying method is applied, four word lines $WL_1$, $WL_2$, $WL_3$ and $WL_4$ and four bit lines $BL_1$, $BL_2$, $BL_3$ and $BL_4$ are provided. Reference numeral 1 designates a NOR type memory cell array including memory cells $C_{11}$, $C_{12}, \ldots, C_{44}$ having the configuration as illustrated in FIG. 1. That is, each of the memory cells $C_{11}$, $C_{12}, \ldots, C_{44}$ has a control gate CG connected to one of the word lines $WL_1$, $WL_2$, $WL_3$ and $WL_4$, a drain D connected to one of the bit lines $BL_1$, $BL_2$, $BL_3$ and $BL_4$, a source S connected to a source circuit 2, and a floating gate FG.

In an erase mode (ER="1"), the source circuit 2 generates the high voltage $V_{PP}$ such as 12 V and applies it to the sources of the memory cells $C_{11}$, $C_{12}, \ldots, C_{44}$. Otherwise, the source circuit 2 applies 0 V to the sources of the memory cells $C_{11}$, $C_{12}, \ldots, C_{44}$. The detail of the source circuit 2 will be explained later.

A row address decoder 3 receives row address signals $\overline{A}_1$ and $\overline{A}_2$ and their inverted signals $A_1$ and $A_2$ from a row address buffer 4, to thereby select one of the word lines $WL_1$, $WL_2$, $WL_3$ and $WL_4$. In an erase mode (ER="1"), however, the row address decoder 3 makes all of the word lines $WL_1$, $WL_2$, $WL_3$ and $WL_4$ low. The details of the row address decoder 3 and the row address buffer 4 will be explained later.

The bit lines $BL_1$, $BL_2$, $BL_3$ and $BL_4$ are connected to column switching transistors $Q_{c1}$, $Q_{c2}$, $Q_{c3}$ and $Q_{c4}$, respectively, of a column switching circuit 5.

A column address decoder 6 receives column address signals $\overline{B}_1$ and $B_2$ and their inverted signals $B_1$ and $\overline{B}_2$ from a column address buffer 7, to thereby select one of column selection lines $CL_1$, $CL_2$, $CL_3$ and $CL_4$, i.e., to select one of the column selecting transistors $Q_{c1}$, $Q_{c2}$, $Q_{c3}$ and $Q_{c4}$ and drive it. Also, in an erase mode (ER="1"), however, the column address decoder 6 makes all of the column selection lines $CL_1$, $CL_2$, $CL_3$ and $CL_4$ low, i.e., turns OFF all of the column switching transistors $Q_{c1}$, $Q_{c2}$, $Q_{c3}$ and $Q_{c4}$, so that all of the drains of the memory cells $C_{11}$, $C_{12}, \ldots, C_{44}$ are in a floating state. The details of the column address decoder 6 and the column address buffer 7 will be explained later.

A row address switching circuit 8 selects a set of external row address signals $A_1'$ and $A_2'$ or a set of internal row address signals $IA_1$ and $IA_2$. That is, in an internal mode ($S_1$="1"), the row address switching circuit 8 selects the internal row address signals $IA_1$ and $IA_2$ and transmits them to the row address buffer 4. Otherwise ($S_1$="0"), the row address switching circuit 8 selects the external row address signals $A_1$ and $A_2$ and transmits them to the row address buffer 4. The details of the row address switching circuit 8 will be explained later.

Similarly, a column address switching circuit 9 selects a set of external column address signals $B_1'$ and $B_2'$ or a set of internal column address signals $IB_1'$ and $IB_2$. That is, in an internal mode ($S_1$="1"), the column address switching circuit 9 selects the internal column address signals $IB_1$ and $IB_2$ and transmits them to the column address buffer 7. Otherwise ($S_1$="0"), the column address switching circuit 9 selects the external row address signals $B_1$ and $B_2$ and transmits them to the column address buffer 7. The details of the column address switching circuit 9 will be explained later.

That is, in an erase mode (ER="1"), in all of the memory cells $C_{11}$, $C_{12}, \ldots, C_{44}$, the voltages at the sources are made the high voltage $V_{PP}$, the voltages at the control gates are made low (0 V), and the drains are in a floating state, so that all of the memory cells $C_{11}$, $C_{12}, \ldots, C_{44}$ are erased simultaneously. Otherwise, i.e., in a read/write mode (ER="0") including a verification mode ($S_1$="1"), one of the memory cells $C_{11}$, $C_{12}, \ldots, C_{44}$ is selected by the row address decoder 3 and the column address decoder 6.

The bit lines $BL_1$, $BL_2$, $BL_3$ and $BL_4$ are connected via the column switching transistors $Q_{c1}$, $Q_{c2}$, $Q_{c3}$ and $Q_{c4}$ to a write amplifier 10 and a sense amplifier 11. The details of the write amplifier 10 and the sense amplifier 11 will be explained later.

An erase signal ER for an erase mode, the internal control signal $S_1$ for an internal mode, and the internal address signals $IA_1$, $IA_2$, $IB_1$ and $IB_2$ are generated by a control circuit 12. Also, the control circuit 12 generates a program signal PG, a program verifying signal PGV, an erase verifying signal ERV, a read signal RD, and transmits them to a $V_{PP}/V_{CC}/V_{PG}/V_{PGV}/V_{ERV}$ voltage generating circuit 13 and the like. Note that the $V_{PP}/V_{CC}/V_{PG}/V_{PGV}/V_{ERV}$ voltage generating circuit 13 generates a high voltage $V_{PP}$ such as 12 V in a program mode (PG="1"), a drain voltage $V_{PG}$ for defining the voltage $V_{44}$ in a program mode (PG="1"), and a low voltage $V_{CC}$ such as 5 V in a non-program mode (PG="0"). Also, the $V_{PP}/V_{CC}/V_{PG}/V_{PGV}/V_{ERV}$ voltage generating circuit 13 generates a voltage $V_{PGV}$ (=$V_{R1}$) such as 7.5 V in a program verifying mode (PGV="1") and a voltage $V_{ERV}$ (=$V_{R2}$) such as 3.5 V in an erase verifying mode (VER="1"). The details of the $V_{PP}/V_{CC}/V_{PG}/V_{PGV}/V_{ERV}$ voltage generating circuit 13 will be explained later.

Next, each block of the device of FIG. 3 will be explained with reference to FIGS. 4 through 10.

Figure 4:
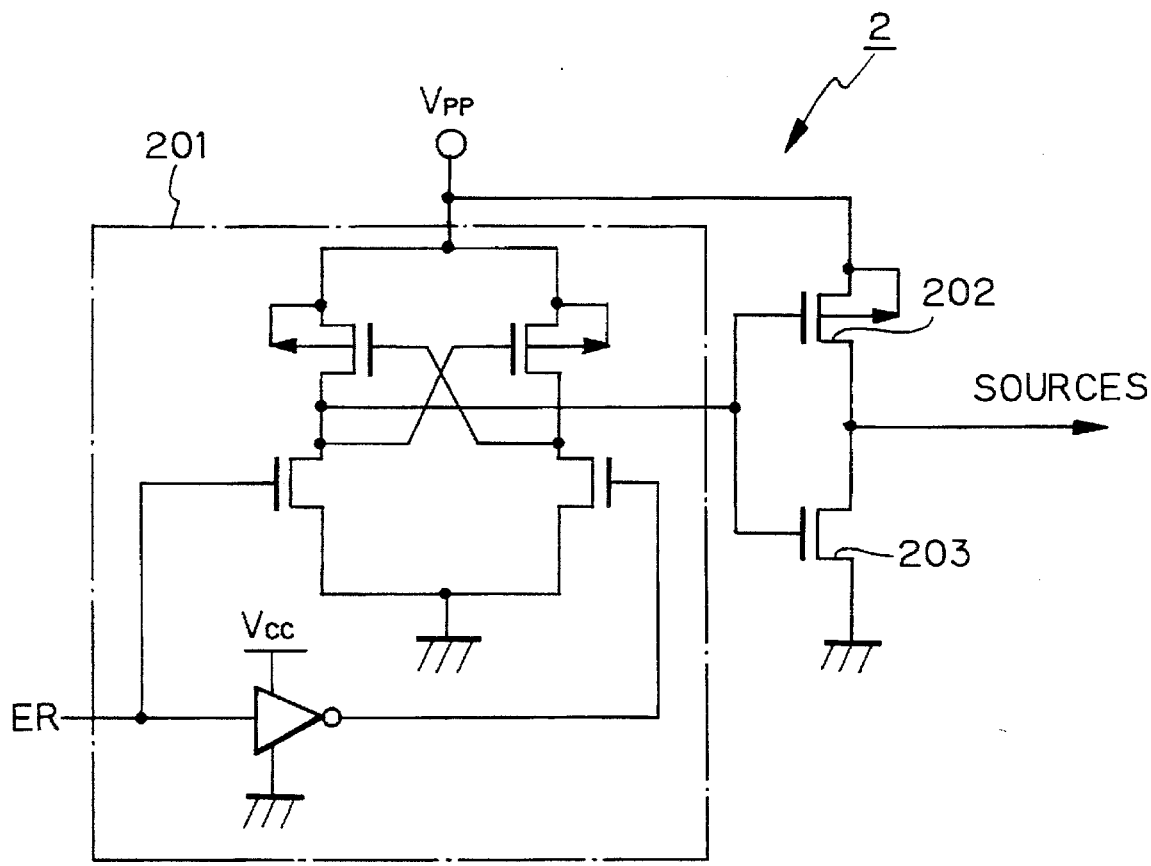
FIG. 4 is a circuit diagram of the source circuit of FIG. 3.
Figure 4:
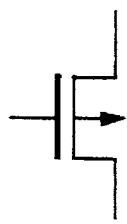
Figure 4:
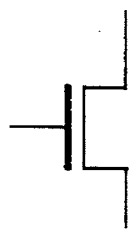

In FIG. 4, which is a detailed circuit diagram of the source circuit 2 of FIG. 3, this circuit 2 includes a level conversion circuit 201, an inverter formed by a P-channel enhancement type transistor 202 and an N-channel enhancement type transistor 203 controlled by the output of the level conversion circuit 201. In an erase mode (ER="1"), the output of the level conversion circuit 201 is low (=0 V), so that the transistors 202 and 203 are turned ON and OFF, respectively. Therefore, the voltages at the sources of the memory cells $C_{11}$, $C_{12}$, ..., $C_{44}$ are high (=$V_{PP}$). Conversely, in a non-erase mode (ER="0"), the output of the level conversion circuit 201 is high (=$V_{PP}$), so that the transistors 202 and 203 are turned OFF and ON, respectively. Therefore, the voltages at the sources of the memory cells $C_{11}$, $C_{12}$, ..., $C_{44}$ are low (=0 V).

Figure 5:
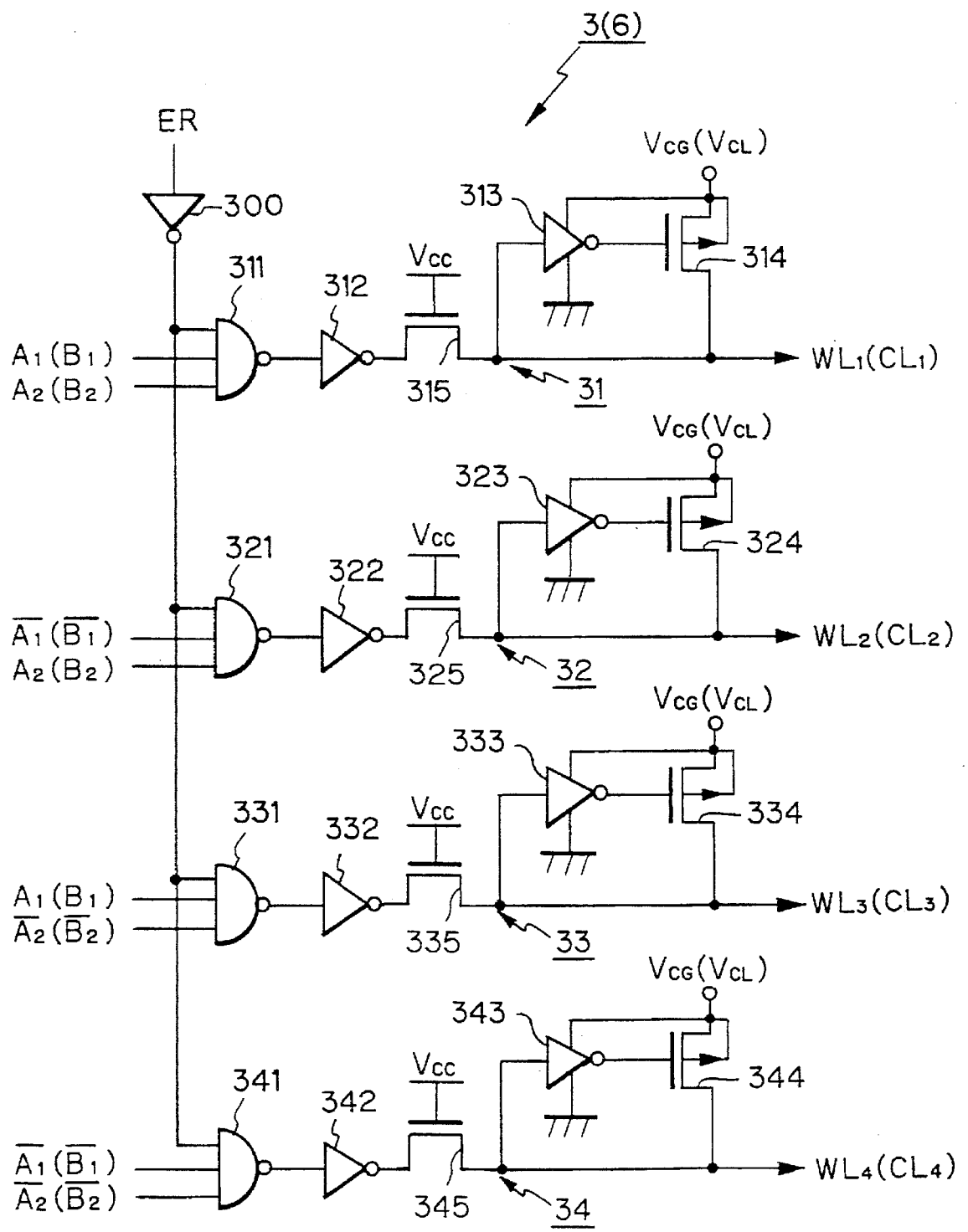
FIG. 5 is a circuit diagram of the address decoder of FIG. 3.

In FIG. 5, which is a detailed circuit diagram of the row address decoder 3 (the column address decoder 6) of/FIG. 3, this address decoder 3 (6) is of a NAND logic type which includes four circuits 31, 32, 33 and 34 for the word lines $WL_1$, $WL_2$, $WL_3$ and $WL_4$ (or the column selection lines $CL_1$, $CL_2$, $CL_3$ and $CL_4$), respectively. The circuits 31 through 34 have the same configuration. For example, the circuit 31 includes a NAND circuit 311 for receiving the address signal $A_1$ and $A_2$ ($B_1$ and $B_2$), an inverter 312, an inverter 313 powered by the voltage $V_{PP}/V_{CC}$, and a P-channel enhancement type transistor 314. The NAND circuit 311 also receives an inverted signal of the erase signal ER via an inverter 300. An N-channel enhancement transistor 315 prevents the P-channel transistor of the inverter 312 from being turned ON when the voltage at the word line $WL_1$ (the column selection signal $CL_1$) is $V_{PP}$. Therefore, in an erase mode (ER="1"), all of the NAND circuits 311 through 341 are disabled, so that all of the word lines $WL_1$, $WL_2$, $WL_3$ and $WL_4$ (the column selection lines $CL_1$, $CL_2$, $CL_3$ and $CL_4$) are made low (=0 V). In this case, since the column selection transistors $Q_{c1}$, $Q_{c2}$, $Q_{c3}$ and $Q_{c4}$ are turned OFF, the drains of the memory cells $C_{11}$, $C_{12}$, ..., $C_{44}$ are in a floating state. Conversely, in a non-erase mode (ER="0"), i.e., in a read/write mode, the output of one of the NAND circuits 311 through 314 is made high in accordance with the address signals $A_1$ and $A_2$, i.e., the voltage at one of the word lines $WL_1$, $WL_2$, $WL_3$ and $WL_4$ (the voltage at one of the column selection lines $CL_1$, $CL_2$ $CL_3$ and $CL_4$) is made high. As a result (=$V_{CG}(V_{CL})$), one of the memory cells $C_{11}$, $C_{12}$, ..., $C_{44}$ is selected, and a read/write operation is performed thereupon.

Figure 6:
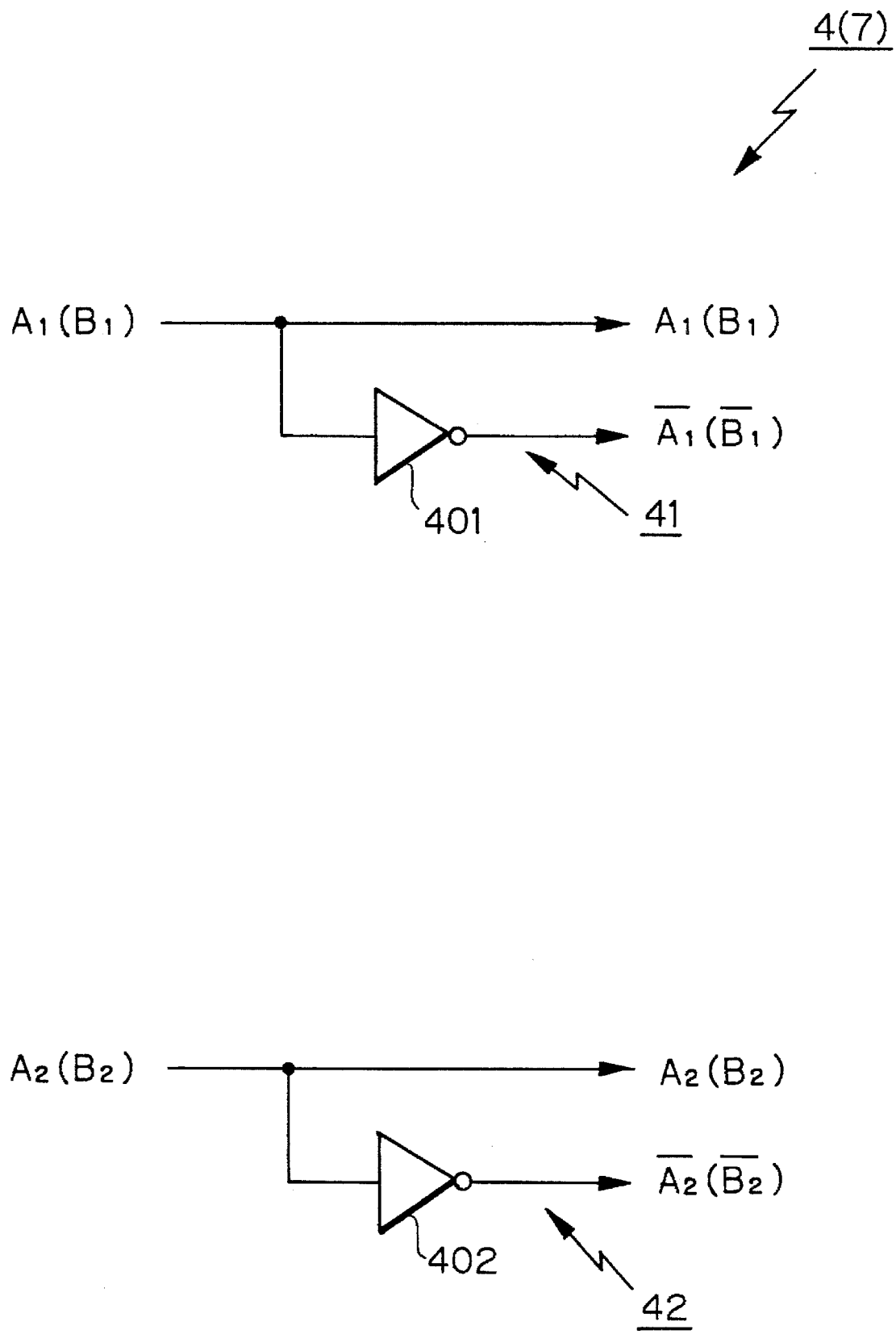
FIG. 6 is a circuit diagram of the address buffer of FIG. 3.

In FIG. 6, which is a detailed circuit diagram of the row address buffer 4 (the column address buffer 7) of FIG. 3, this address buffer 4 (7) includes two circuits 41 and 42 each of which is formed by inverters 401 and 402. Therefore, the address buffer 4 (7) generates the address signals $A_1$ and $A_2$ ($B_1$ and $B_2$) and their inverted signals $\overline{A_1}$ and $\overline{A_2}$ ($\overline{B_1}$ and $\overline{B_2}$).

Figure 7:
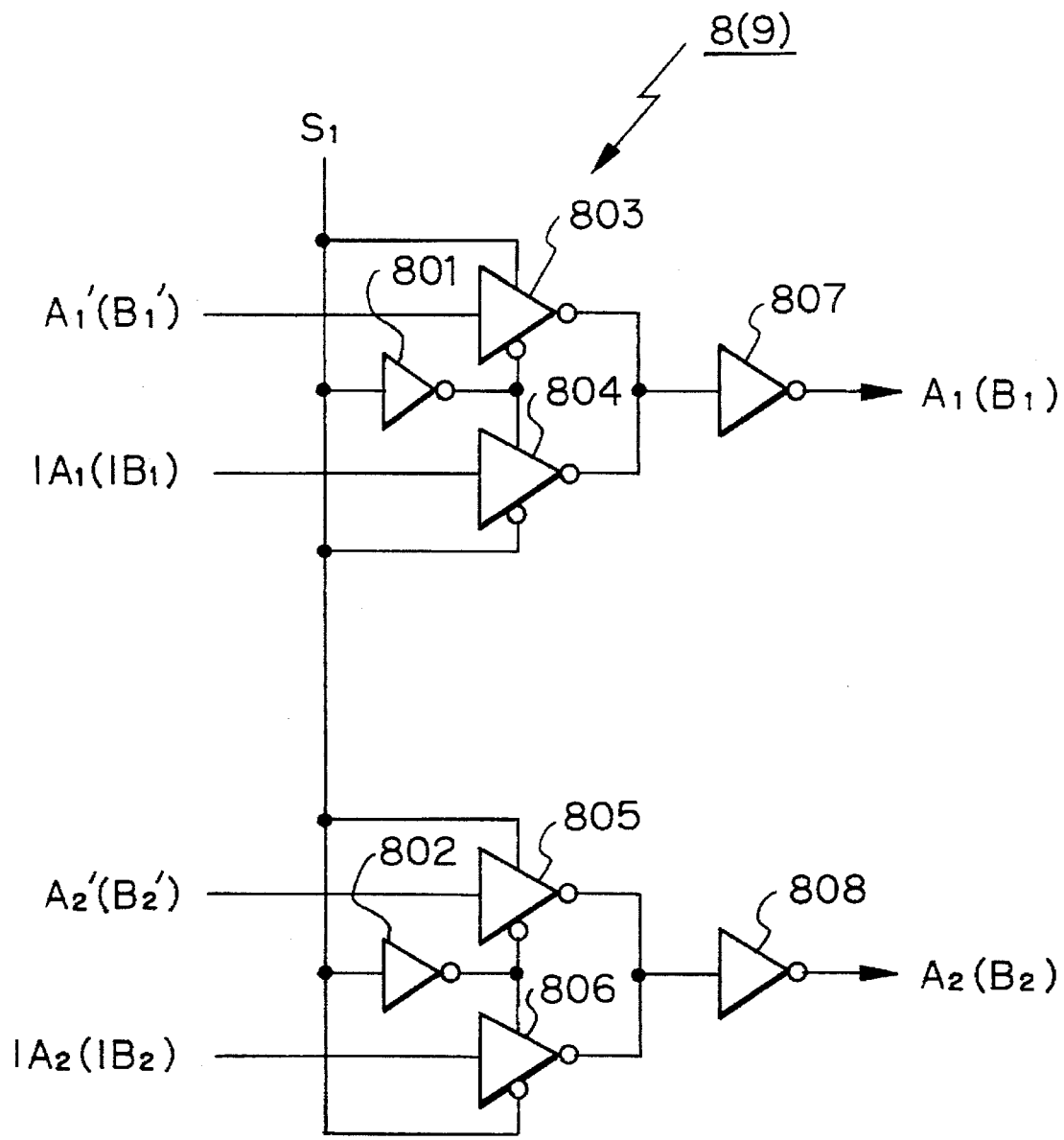
FIG. 7 is a circuit diagram of the address switching circuit of FIG. 3.
Figure 7:
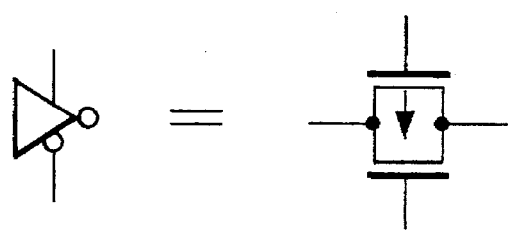

In FIG. 7, which is a detailed circuit diagram of the row address switching circuit 8 (the column address switching circuit 9) of FIG. 3, this address switching circuit 8 (9) includes two inverters 801 and 802 for receiving the internal control signal $S_1$, four transfer gates 803, 804, 805 and 806 controlled by the internal control signal $S_1$ and its inverted signal, and two inverters 807 and 808. For example, in an internal mode ($S_1$="1"), the transfer gates 803 and 805 are turned OFF and the transfer gates 804 and 806 are turned ON, and therefore, the internal address signals $IA_1$ and $IA_2$ ($IB_1$ and $IB_2$) pass through the transfer gates 804 and 806, respectively. As a result, the address signals $A_1$ and $A_2$ ($B_1$ and $B_2$) are the same as the internal address signals $IA_1$ and $IA_2$ ($IB_1$ and $IB_2$), respectively. Conversely, in a non-internal mode ($S_1$="0"), the transfer gates 803 and 805 are turned ON and the transfer gates 804 and 806 are turned OFF, and therefore, the external address signals $A_1'$ and $A_2'$ ($B_1'$ and $B_2'$) pass through the transfer gates 803 and 805, respectively. As a result, the address signals $A_1$ and $A_2$ ($B_1$ and $B_2$) are the same as the external address signals $A_1'$ and $A_2'$ ($B_1'$ and $B_2'$), respectively.

Figure 8:
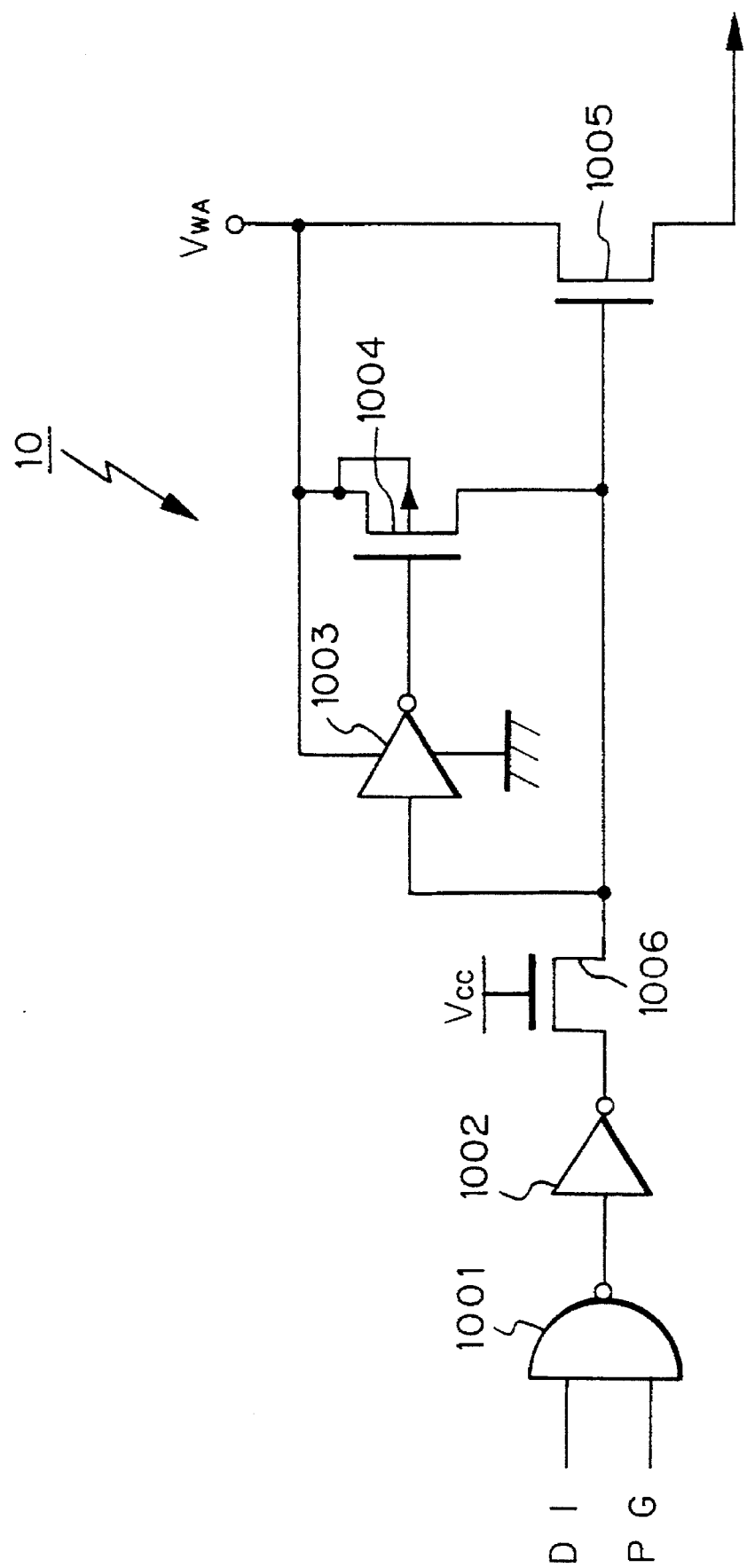
FIG. 8 is a circuit diagram of the write amplifier of FIG. 3.

In FIG. 8, which is a detailed circuit diagram of the write amplifier 10 of FIG. 3, this write amplifier 10 includes a NAND circuit 1001 for receiving the program signal PG and an input data DI, an inverter 1002, an inverter 1003 powered by the voltage $V_{PP}$, a P-channel enhancement type transistor 1004, and an N-channel enhancement type transistor 1005. Also, an N-channel enhancement transistor 1006 prevents the P-channel transistor of the inverter 1002 from being turned ON when the drain of the transistor 1004 is $V_{PP}$. That is, only when both of the inputs DI and PG of the NAND circuit 1001 are high, is the source of the transistor 1005 made high (=$V_{PP}$), thus carrying out a write operation.

Figure 9:
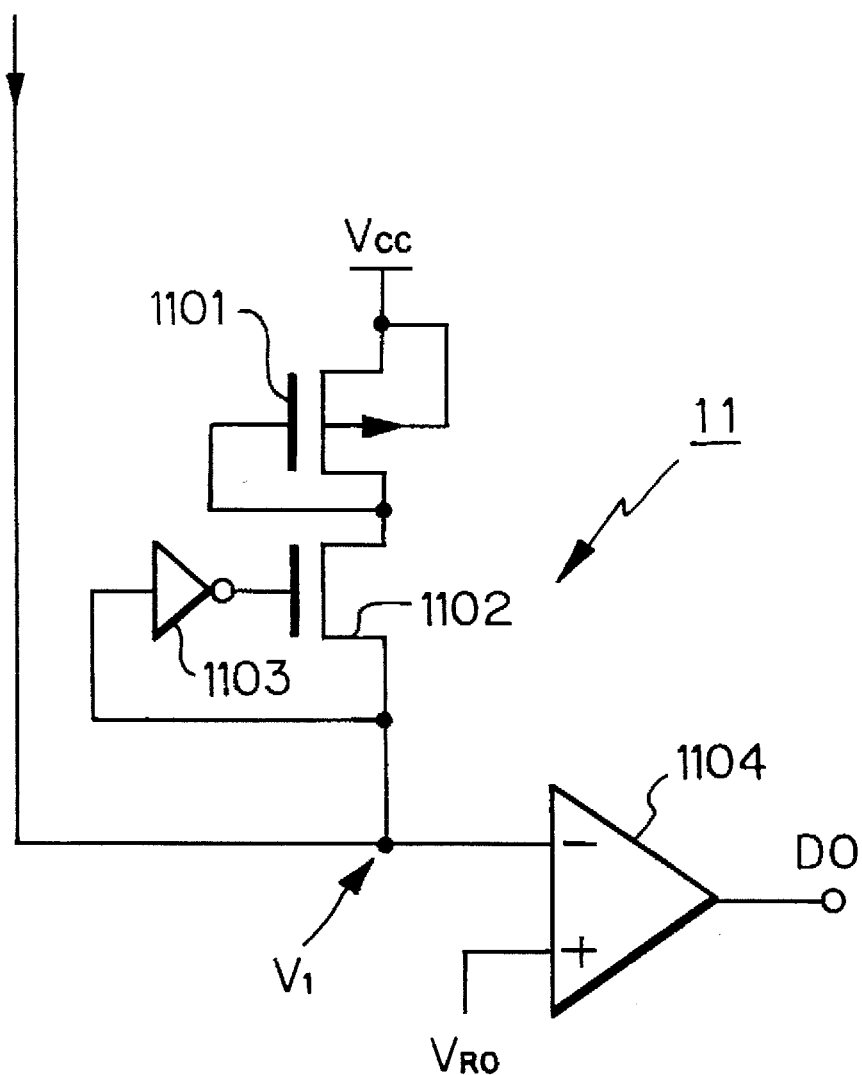
FIG. 9 is a circuit diagram of the sense amplifier of FIG. 3.

In FIG. 9, which is a detailed circuit diagram of the sense amplifier 11 of FIG. 3, the sense amplifier 11 includes a P-channel enhancement type transistor 1101, an N-channel enhancement type transistor 1102, an inverter 1103, and a comparator 1104. In this case, the transistor 1101 serves as a load, and the transistor 1102 and the inverter 1103 serve as a bias circuit. In a read mode, the voltage $V_1$ at an input of the comparator 1104 is changed in accordance with a selected memory cell, and therefore, the voltage $V_1$ is compared with a reference voltage $V_{RO}$ by the comparator 1104. Thus, data DO is output from the comparator 1104.

Figure 10:
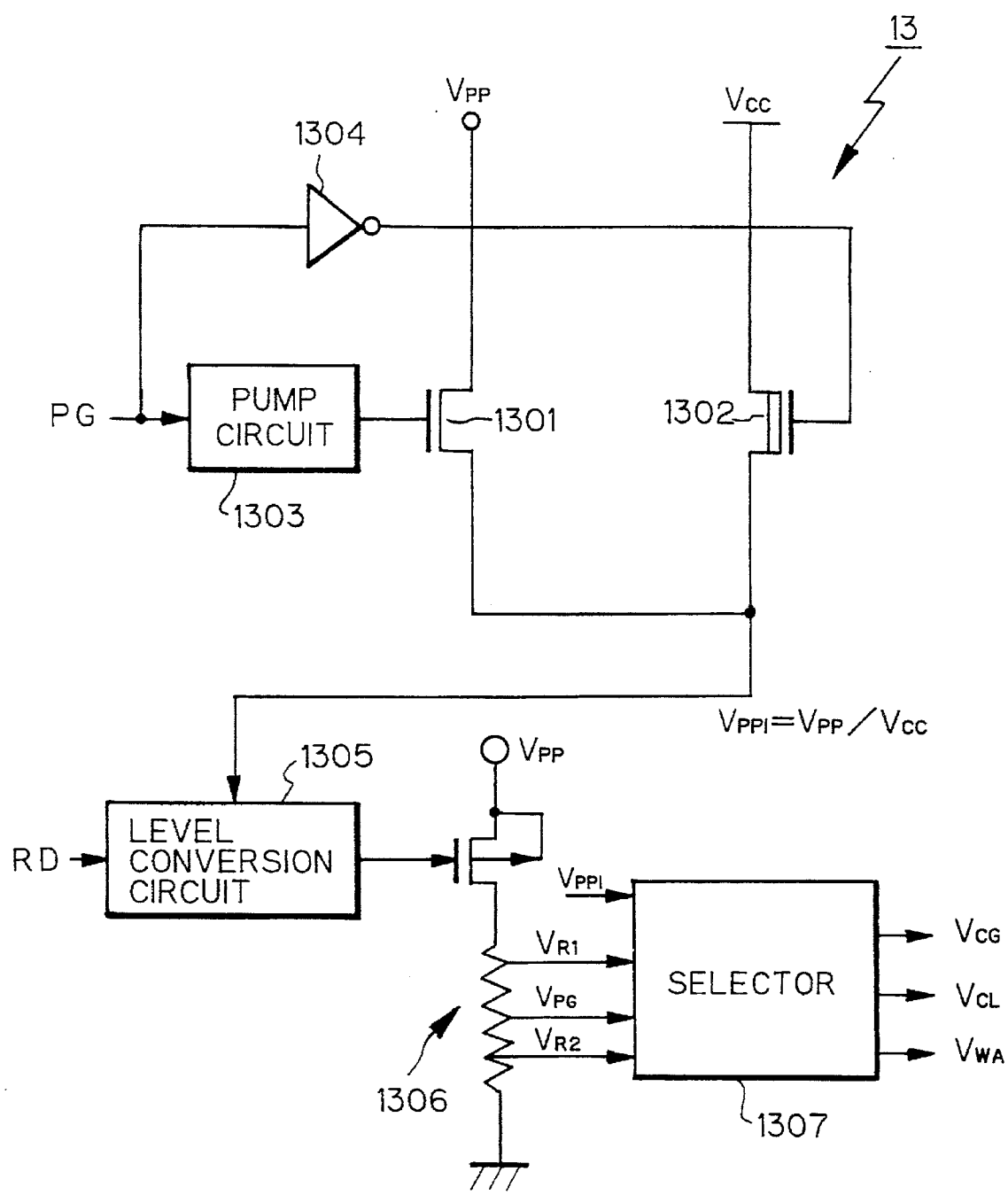
FIG. 10 is a circuit diagram of the voltage generating circuit of FIG. 3.

In FIG. 10, which is a detailed circuit diagram of the $V_{PP}/V_{CC}/V_{PG}/V_{PGV}/V_{ERV}$ voltage generating circuit 13 of FIG. 3, this circuit 13 includes an N-channel enhancement type transistor 1301 connected to a high voltage supply $V_{PP}$, and an N-channel depletion type transistor 1302 connected to a voltage supply $V_{CC}$. The transistor 1301 is controlled by a pump circuit 1303 which generates a high voltage higher than $V_{PP}$, while the transistor 1302 is controlled by an inverter 1304. The pump circuit 1303 and the inverter 1304 are both controlled by the control signal PG. If PG="1", the pump circuit 1303 is enabled to turn ON the transistor 1301, so that the internal voltage $V_{PPI}$=$V_{PP}/V_{CC}$ equals $V_{PP}$. Contrary to this, if PG="0", the output of the inverter 1302 is made high (=$V_{CC}$) to turn ON the transistor 1302, so that the internal voltage $V_{PPI}$ (=$V_{PP}/V_{CC}$) equals $V_{CC}$. This internal voltage $V_{PPI}$ is applied to a level conversion circuit 1305 controlled by the read signal RD. The level conversion circuit 1305 has the similar configuration as the level conversion circuit 201 of FIG. 4. When the read signal RD is high, the level conversion circuit 1305 generates a high level signal and transmits it to a voltage divider 1306, while when the read signal RD is low, the level conversion circuit 1305 generates low level signal and transmits it to the voltage divider 1306. Therefore, only when the read signal RD is low (RD ="0"), the voltage divider 1306 generates a first reference voltage $V_{R1}$, the program voltage $V_{PG}$, and a second reference voltage $V_{R2}$. The voltages $V_{R1}$, $V_{PG}$ and $V_{R2}$ in addition to the internal voltage $V_{PPI}$ are applied to a selector 1307 controlled by the control circuit 12. In this case, the selector 1307 operates as follows: a voltage $V_{CG}$ applied to the row address decoder 3 is $V_{CG}=V_{PPI}=V_{PP}$ in a write mode;

$V_{CG}=V_{PPI}=V_{CC}$ in a read mode;

$V_{CG}=V_{VPGV}=V_{R1}$ in a write verifying mode;

and $V_{CG}=V_{ERV}=V_{R2}$ in a erase verifying mode.

Also, a voltage $V_{CL}$ applied to the column address decoder 6 is $V_{CL}=V_{PPI}=V_{PP}$ in a write mode; and $V_{CL}=V_{PPI}=V_{CC}$ in other modes.

Further, a voltage $V_{WA}$ applied to the write amplifier 10 is $V_{WA}=V_{PG}$.

Figure 11A:
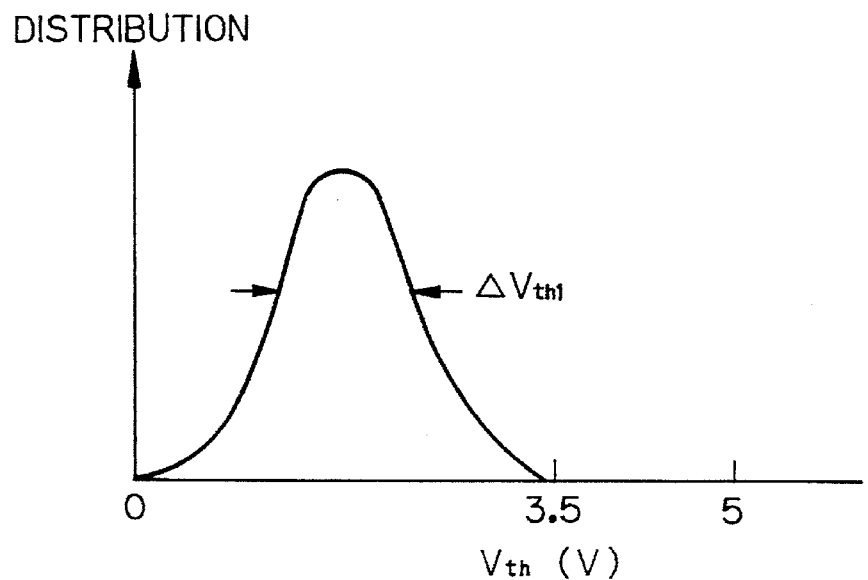
FIGS. 11A and 11B are graphs showing the principle of a first prior art erasing and verifying method.
Figure 11B:
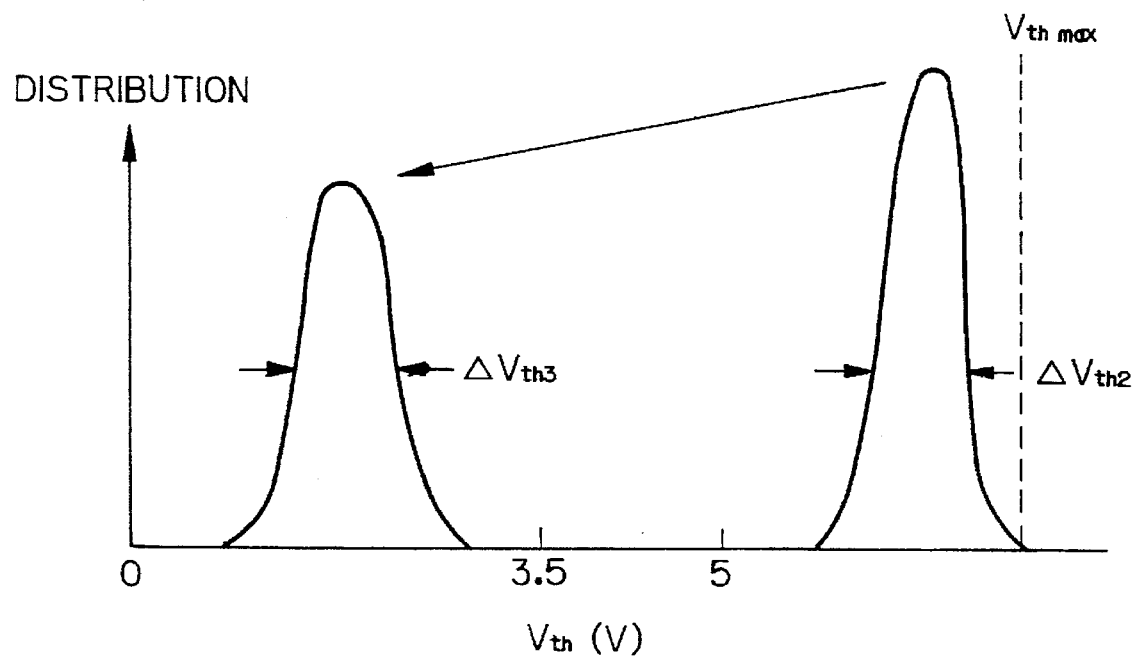

FIGS. 11A and 11B are graphs showing the principle of a first prior art erasing and verifying method. When a flash erase operation is simply performed upon the memory cells, a distribution of threshold voltage is as shown in FIG. 11A. In this case, the deviation width $\Delta V_{th1}$ thereof is relatively large. However, when a write operation is performed upon the memory cells, a threshold voltage $V_{th}$ is increased as shown in FIG. 11B. In this case, when the threshold voltage $V_{th}$ is increased, an electric field between the channel region C and the floating gate FG is weakened. As a result, the threshold voltage $V_{th}$ is brought close to a maximin value $V_{thmax}$. Therefore, after a write operation is completed, the deviation $\Delta V_{th2}$ of threshold voltage becomes relatively small. Thereafter, when a flash erase operation is performed upon the memory cells, the deviation $\Delta V_{th3}$ of threshold voltage becomes smaller than the deviation $\Delta V_{th1}$ of FIG. 11A.

A first prior art erasing and verifying method using the device of FIG. 3 is explained next with reference to FIG. 12.

At step 1201, values N1 and N2 are initialized, i.e.,

N1←0

N2←0.

Next, at step 1202, a write operation is performed upon all of the memory cells $C_{11}, C_{12}, \ldots, C_{44}$. In this case, the program signal PG, the erase signal ER, the internal control signal $S_1$ and the write data DI are

PG="1"

ER="0"

$S_1$="1"

DI="0".

In this state, an internal address defined by ($IA_1, IA_2, IB_1, IB_2$) is changed from (0, 0, 0, 0) to (1, 1, 1, 1). As a result, in a memory cell selected by the internal address, the voltage $V_{PP}$ is applied to the control gate CG, and the voltage $V_{dd}$, which is lower than $V_{PP}$ by a threshold voltage of the column selection transistor such as $Q_{c1}$, is applied to the drain region D. Also, the source region S is grounded by the source circuit 2. When a write operation upon all the memory cells $C_{11}, C_{12}, \ldots, C_{44}$ is completed, the control proceeds to step 1203.

At step 1203, a write verification is carried out. That is, it is determined whether or not the threshold voltage of each memory cell is higher than a first reference voltage $V_{R1}$. For example, the first reference voltage $V_{R1}$ is $V_{R1}=V_{PGV}=7.5$ V.

In this case, the program signal PG, the erase signal ER and the internal control signal $S_1$ are

PG="0"

ER="0"

$S_1$="1".

In this state, an internal address defined by ($IA_1, IA_2, IB_1, IB_2$) is changed from (0, 0, 0, 0) to (1, 1, 1, 1). As a result, in a memory cell selected by the internal address, the voltage $V_{R1}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 1206. Otherwise, the control proceeds to steps 1204 and 1205.

Steps 1204 and 1205 repeat a write operation at step 1204 and a write verification at step 1205 within definite times defined by $N1_o$. That is, when the value N1 reaches $N1_o$, the control proceeds to a failure mode step 1211 which determines the device as a defective (unaccepted) one.

At step 1206, a flash erase operation is performed upon all of the memory cells $C_{11}, C_{12}, \ldots, C_{44}$. In this case, the program signal PG, the erase signal ER and the internal control signal $S_1$ are

PG="0"

ER="1"

$S_1$="0".

As a result, in the memory cells $C_{11}, C_{12}2, \ldots, C_{44}$, the voltages at the sources are high (=$V_{PP}$), the voltages at the gates are 0 V, and the drains are in a floating state. This state is maintained for a predetermined time period, so that the electrons at the floating gates are expelled therefrom, so as to reduce the threshold voltages of the memory cells. Then, the control proceeds to step 1207.

At step 1207, an erase verification is carried out. That is, it is determined whether or not the threshold voltage of each memory cell is lower than a second reference voltage $V_{R2}$. For example, the second reference voltage $V_{R2}$ is $V_{R2}=V_{ERV}=3.5$ V.

In this case, the program signal PG, the erase signal ER and the internal control signal $S_1$ are

PG="0"

ER="0"

$S_1$="1".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{R2}$ is applied to the control gate CG, while the source region S is grounded by the source circuit 2. Therefore, the data stored in the floating gate FG is output to the sense amplifier 11, and it is determined whether this data DO is "1". When all data of the memory cells are "1", the control proceeds to step 1210. Otherwise, the control proceeds to steps 1208 and 1209.

Steps 1208 and 1209 repeat an flash erase operation at step 1206 and an erase verification at step 1207 within definite times defined by $N2_o$. That is, when the value N2 reaches $N2_o$, the control proceeds to the failure mode step 1211 which determines the device as a defective (unaccepted) one.

At step 1210, the device is determined as an accepted one.

Then, this routine is completed by step 1212.

Figure 12:
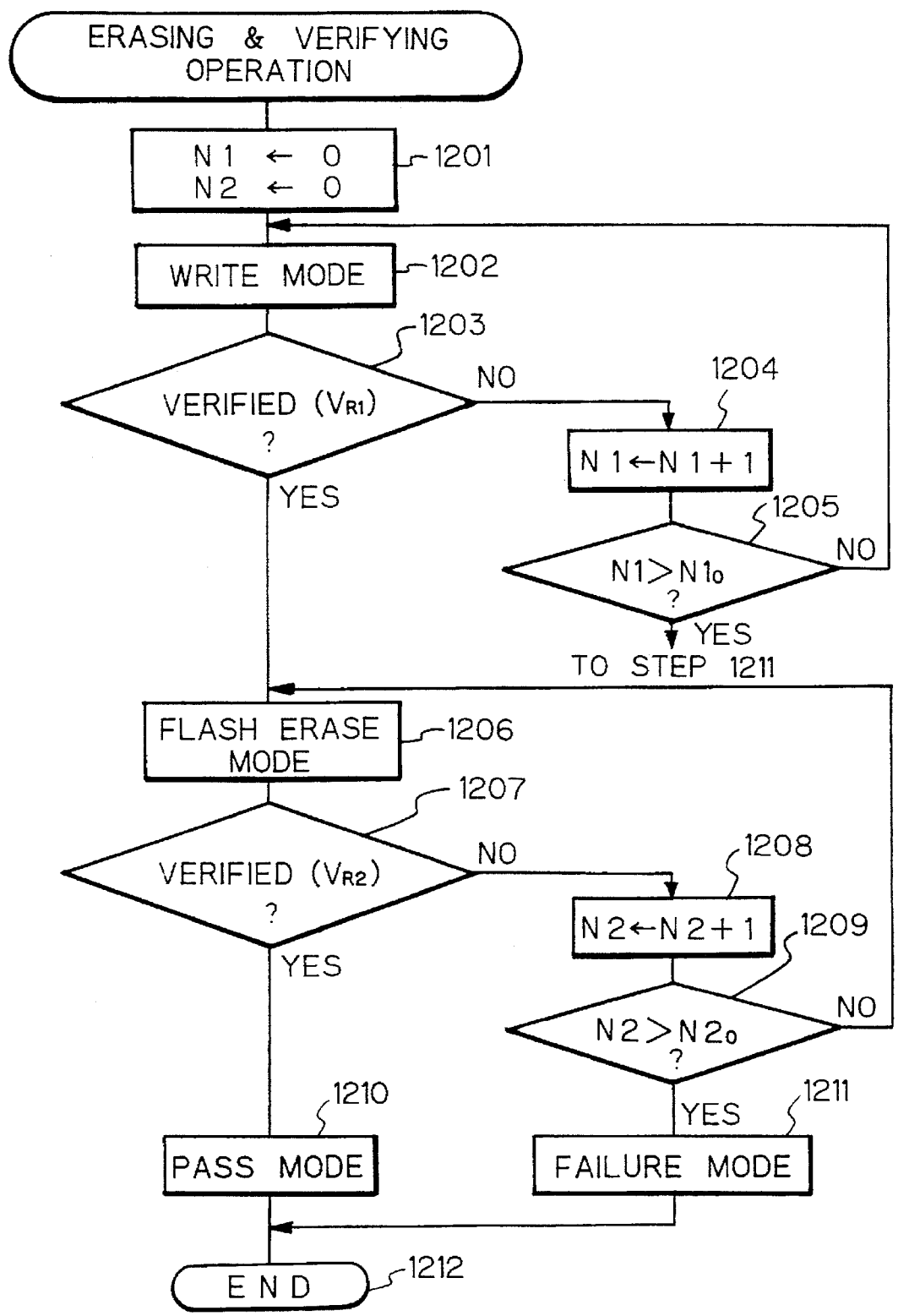
FIG. 12 is a flowchart showing the operation of the control circuit of FIG. 3 for carrying out the first prior art erasing and verifying method.
Figure 13:
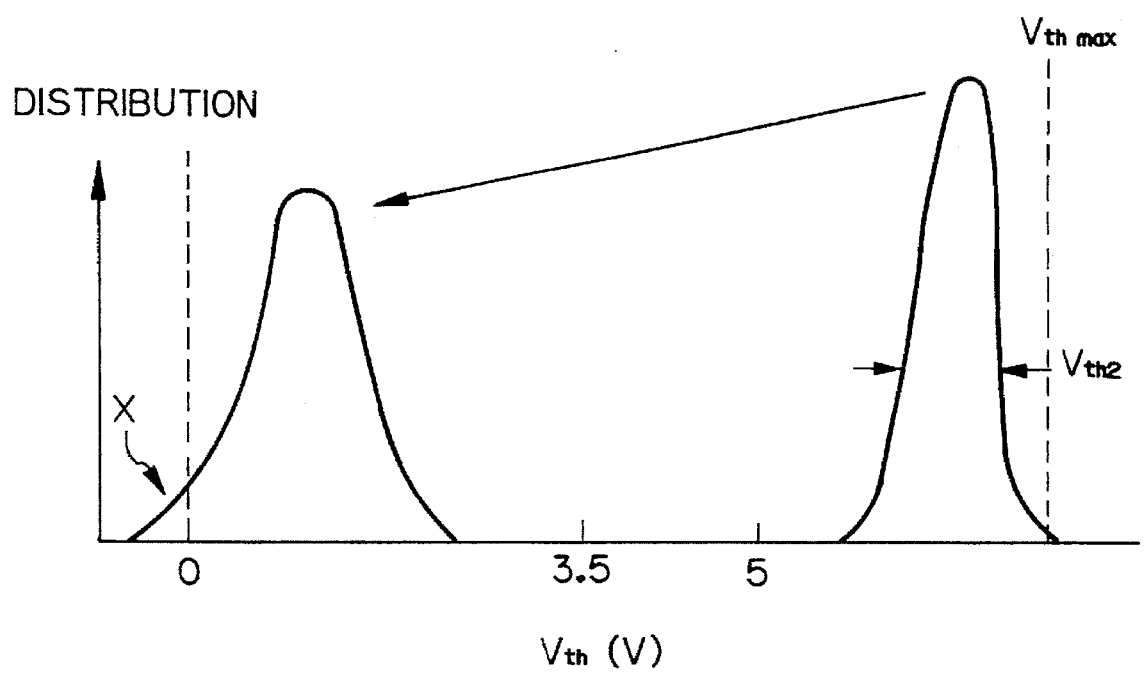
FIG. 13 is a graph showing a problem in the first prior art erasing and verifying method.

In the first prior art erasing and verifying method as shown in FIG. 12, however, if some of the memory cells enter a depletion state as indicated by an arrow X in FIG. 13, it is impossible to relieve such memory cells. Note that the depletion state memory cells invite a malfunction of write/read operation.

Figure 14:
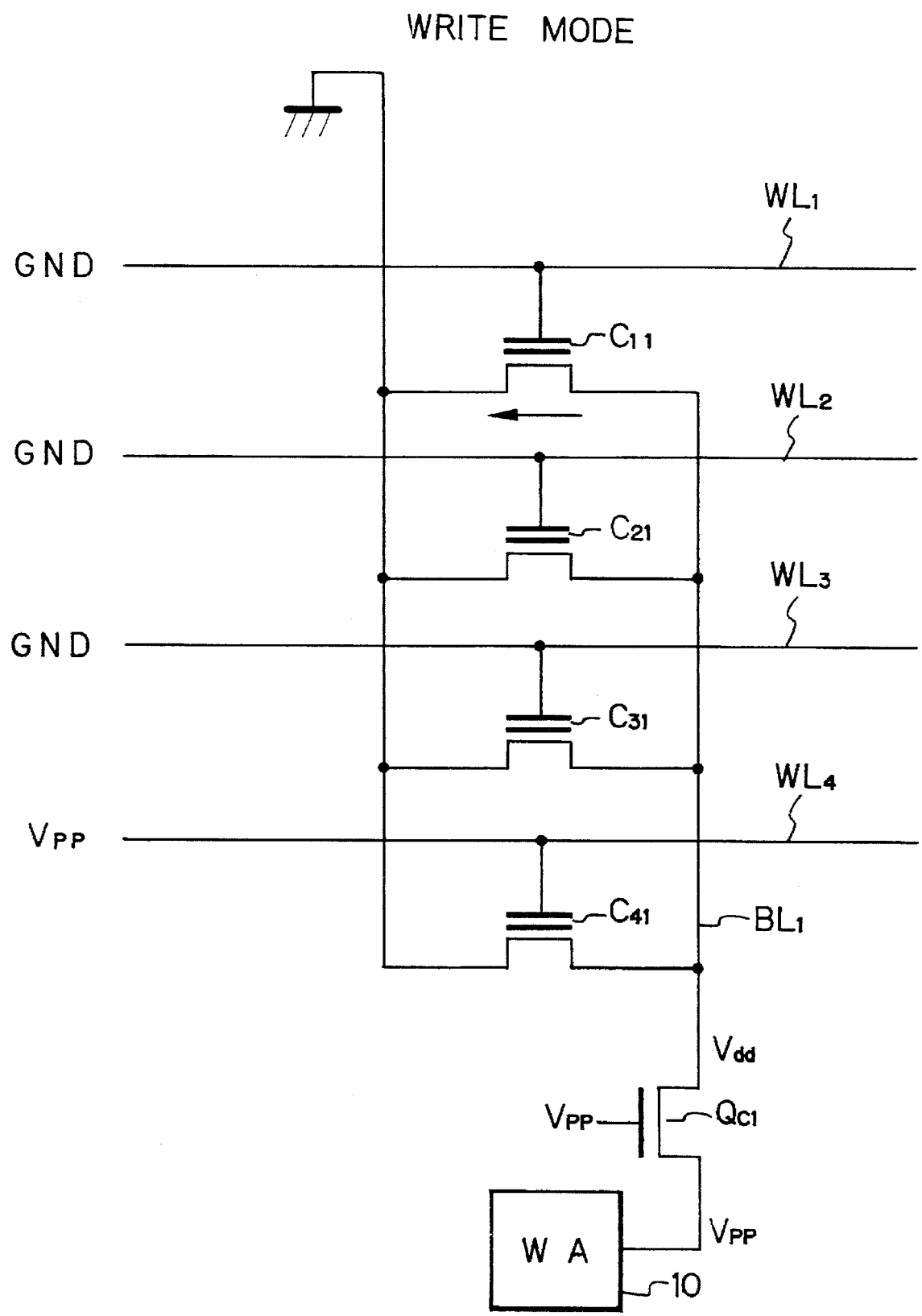
FIG. 14 is a circuit diagram showing a malfunction of a write operation where a depletion state memory cell is present.

For example, in FIG. 14, assume that the memory cell $C_{11}$ is in a depletion state. In this case, when a write operation is performed upon the memory cell $C_{41}$, a current flows through the memory cell $C_{11}$, so that the drain voltage $V_{dd}$ of the memory cell $C_{41}$ is reduced. As a result, the write operation upon the memory cell $C_{41}$ may become incomplete.

Figure 15:
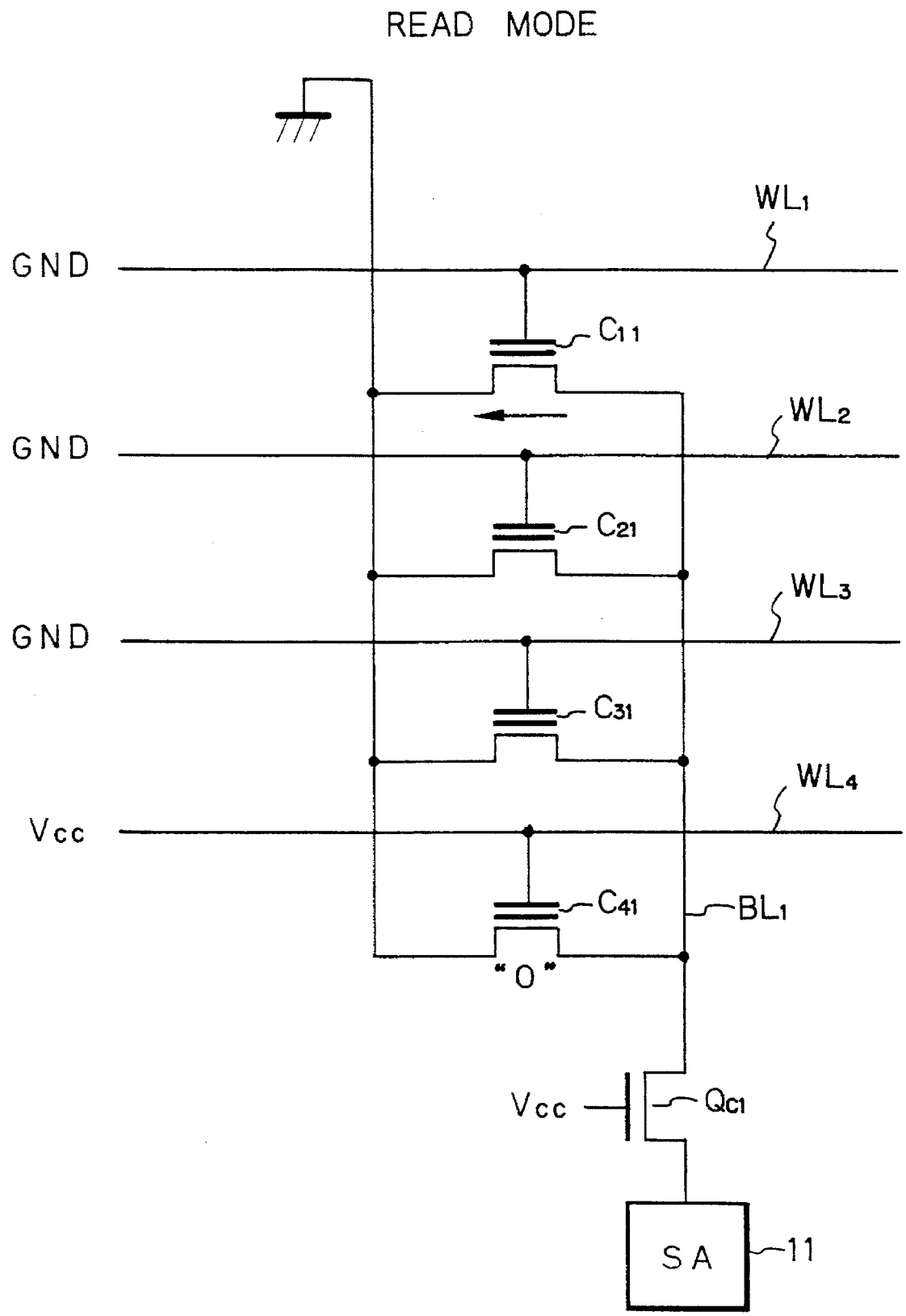
FIG. 15 is a circuit diagram showing a malfunction of a read operation where a depletion state memory cell is present.

Also, in FIG. 15, assume that the memory cell $C_{11}$ is in a depletion state, and the memory cell $C_{41}$ stores data "0", i.e., the threshold voltage of the memory cell $C_{41}$ is higher than $V_{CC}$. In this case, when a read operation is performed upon the memory cell $C_{41}$, a current flows through the memory cell $C_{11}$, so that the voltage of the bit line $BL_1$ is reduced. As a result, the data of the memory cell $C_{41}$ may be recognized as data "1" by the sense amplifier 11.

Figure 16A:
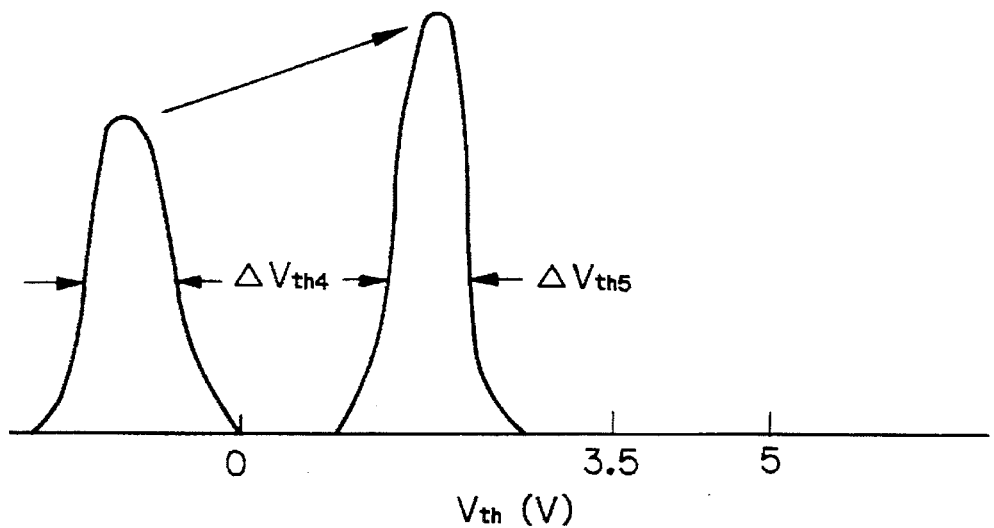
FIGS. 16A and 16B are graphs showing the principle of a second prior art erasing and verifying method.
Figure 16B:
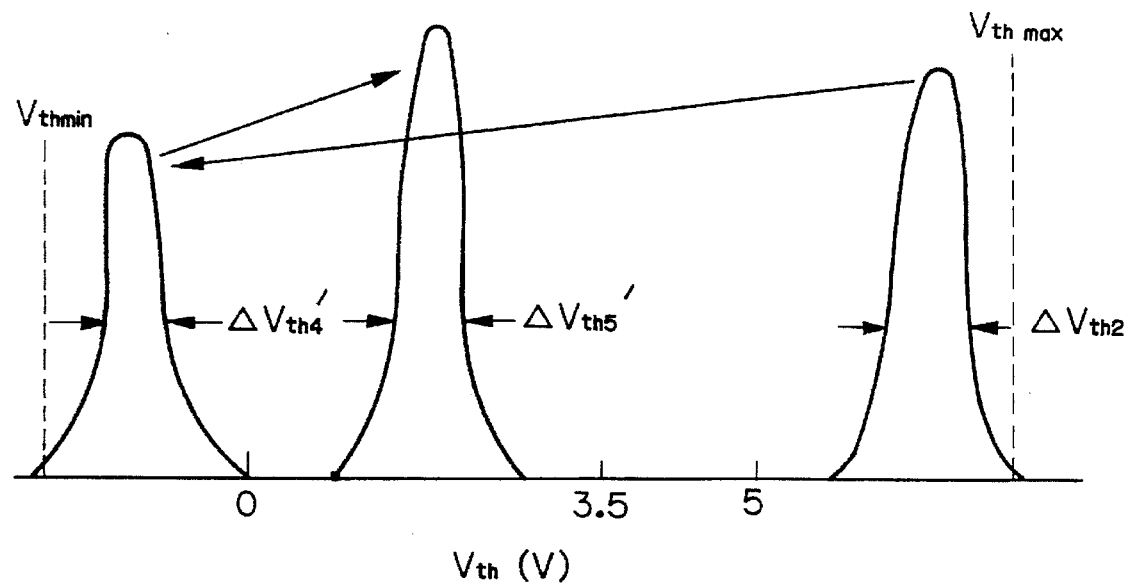

FIGS. 16A and 16B are graphs showing the principle of a second prior art erasing and verifying method. As shown in FIG. 16A, when the threshold voltage is distributed in a depletion state, a threshold voltage recovering operation for increasing the threshold voltage is performed upon the memory cells, to reduce the deviation of threshold voltage from $\Delta V_{th4}$ to $\Delta V_{th5}$. Also, as shown in FIG. 16B, when an overerasing operation is performed upon the memory cells, the threshold voltage is reduced. In this case, when the threshold voltage $V_{th}$ is decreased, an electric field between the source region S and the floating gate FG is weakened. As a result, the threshold voltage $V_{th}$ is brought close to a minimum value $V_{thmin}$. Therefore, after the overerasing operation is completed, the deviation $\Delta V_{th4}'$ of threshold voltage becomes relatively small. Thereafter, when a threshold voltage recovering operation is performed upon the memory cells, the deviation $\Delta V_{th5}'$ of threshold voltage becomes smaller than the deviation $\Delta V_{th1}$ of FIG. 11A.

Figure 17:
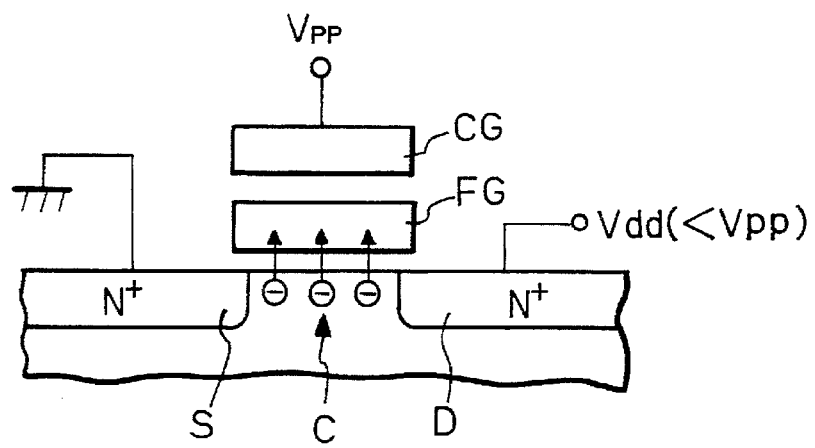
FIG. 17 is a cross-sectional view showing a threshold voltage recovering operation.

One threshold voltage recovering operation is shown in FIG. 17 (see: K. Oyama et al., "A Novel Erasing Technology for 3.3 V Flash Memory with 64 Mb Capacity and Beyond", IEDM Technical Digest, 1992, pp. 607–610). That is, the voltage $V_{PP}$ is applied to the control gate CG, while the source region S is grounded. In this case, the drain region D is in a floating state, and therefore, the channel region C and the drain region D are substantially grounded. As a result, a high electric field is generated between the floating gate FG and the channel region C, and therefore, electrons in the channel region C are introduced into the floating gate FG, to increase the threshold voltage. In this case, the increase of the threshold voltage is dependent upon the threshold voltage per se before the threshold voltage recovering operation. The lower the threshold voltage before the threshold voltage recovering operation, the greater the increase of the threshold voltage by the threshold voltage recovering operation. Thus, the threshold voltage recovering operation as shown in FIG. 17 reduces the deviation of the threshold voltage, and as a result, the generation of depletion state memory cells can be avoided. Also, this can secure a large amount of current flowing through the memory cells, to increase the operation speed.

Figure 18A:
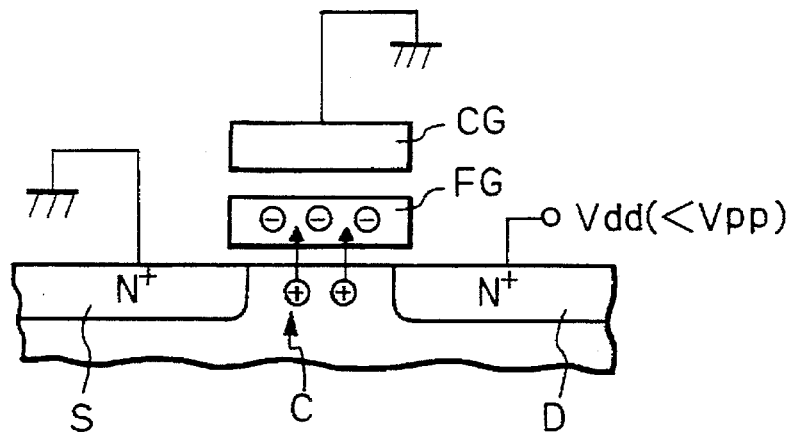
FIGS. 18A and 18B are cross-sectional views showing another threshold voltage recovering operation.
Figure 18B:
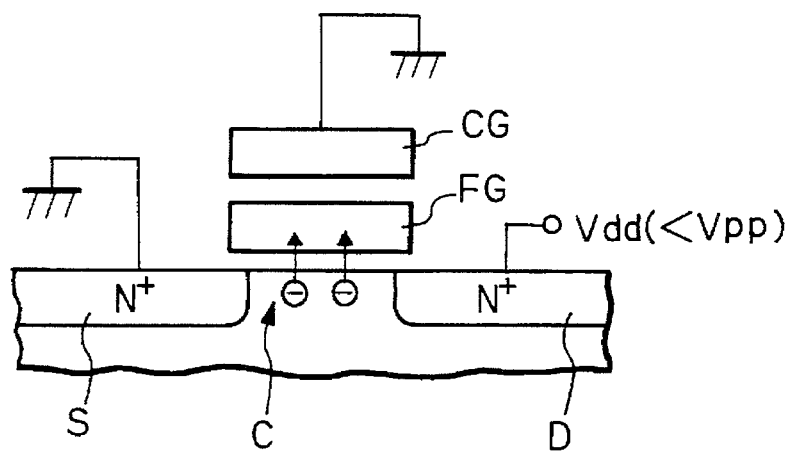

Another threshold voltage recovering operation is shown in FIGS. 18A and 18B (S. Yamada et al., "A SELF-CONVERGENCE ERASING SCHEME FOR A SIMPLE STACKED GATE FLASH MEMORY", IEDM Technical Digest, 1991 pp. 307–310). That is, the voltage $V_{dd}$ is applied to the drain region D, while the source region S and the control gate CG are grounded. As a result, a high electric field is generated between the drain region D and the source region S, and therefore, hot carriers (electron-hole pairs) are generated in the channel region C. When, the electrons stored in the floating gate FG are rich, an electric field flows from the channel region C to the floating gate FG, so that hot holes are introduced into the floating gate FG as shown in FIG. 18A. Contrary to this, when the electrons stored in the floating gate FG are lean, an electric field flows from the floating gate FG to the channel region C, so that hot electrons are introduced into the floating gate FG as shown in FIG. 18B. In other words, the threshold voltages of the memory cells converge to a certain value by the threshold voltage recovering operation as shown in FIGS. 18A and 18B. Also, when the memory cells are in a depletion state, electrons are introduced into the floating gates, to increase the threshold voltages thereof. Thus, the threshold voltage recovering operation as shown in FIG. 18A and 18B reduces the deviation of the threshold voltage, and as a result, the generation of depletion state memory cells can be avoided. Also, this can secure a large amount of current flowing through the memory cells, to increase the operation speed.

Figure 19:
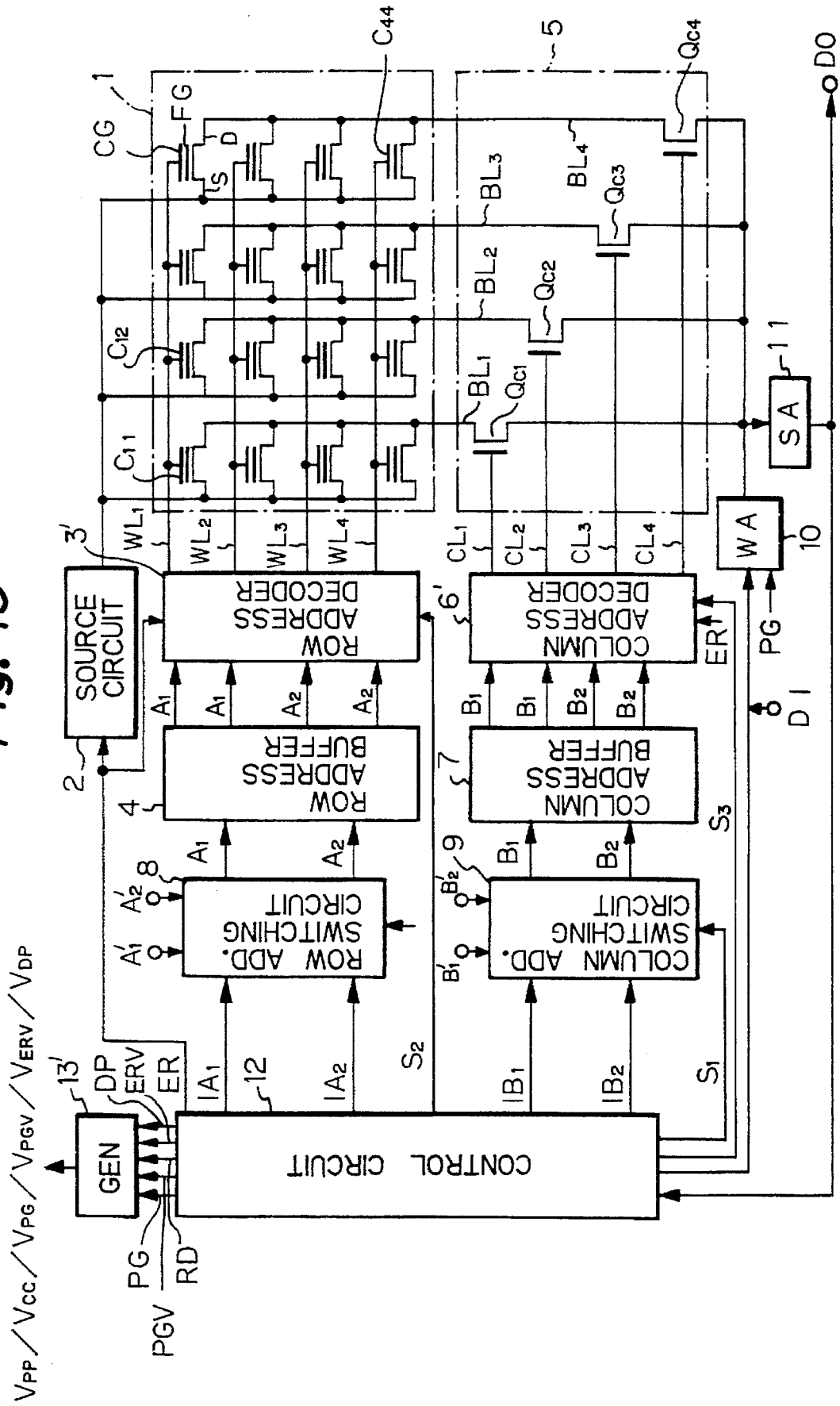
FIG. 19 is a block circuit diagram illustrating a nonvolatile semiconductor memory device to which a second prior art erasing and verifying method and embodiments of the present invention are applied.

In FIG. 19, which is a block circuit diagram illustrating a nonvolatile semiconductor memory device to which the second prior art erasing and verifying method and embodiments of the present invention are applied, the row address decoder 3 and the column address decoder 6 of FIG. 3 are modified to a row address decoder 3' and a column address decoder 6', respectively. Control signal $S_2$ and $S_3$ are supplied from the control circuit 12 to the row address decoder 3' and the column address decoder 6', respectively. For example, when the control signal $S_2$ is low, the row address decoder 3' serves as the row address decoder 3 of FIG. 3, while when the control signal $S_2$ is high, the voltages at all the word lines $WL_1$, $WL_2$, $WL_3$ and $WL_4$ are $V_{CG}$. Also, when the control signal $S_3$ is low, the column address decoder 6' serves as the column address decoder 6 of FIG. 3, while when the control signal $S_3$ is high, the voltages at all the column selection lines $CL_1$, $CL_2$, $CL_3$ and $CL_4$ are grounded, and therefore, the bit lines $BL_1$, $BL_2$, $BL_3$ and $BL_4$ are in a floating state.

Also, in FIG. 19, the $V_{PP}/V_{CC}/V_{PG}/V_{PGV}/V_{ERV}$ voltage generator 13 of FIG. 3 is modified to a $V_{PP}/V_{CC}/V_{PG}/V_{PGV}/V_{ERV}/V_{DP}$ voltage generator 13' which generates a verification voltage $V_{DP}$ in addition to the voltages $V_{PP}$, $V_{CC}$, $V_{CG}$ $V_{CL}$ and $V_{WA}$. The verification voltage $V_{DP}$ is used for verifying whether or not the memory cells $C_{11}, C_{12}, \ldots, C_{44}$ are in a depletion state.

Figure 20A:
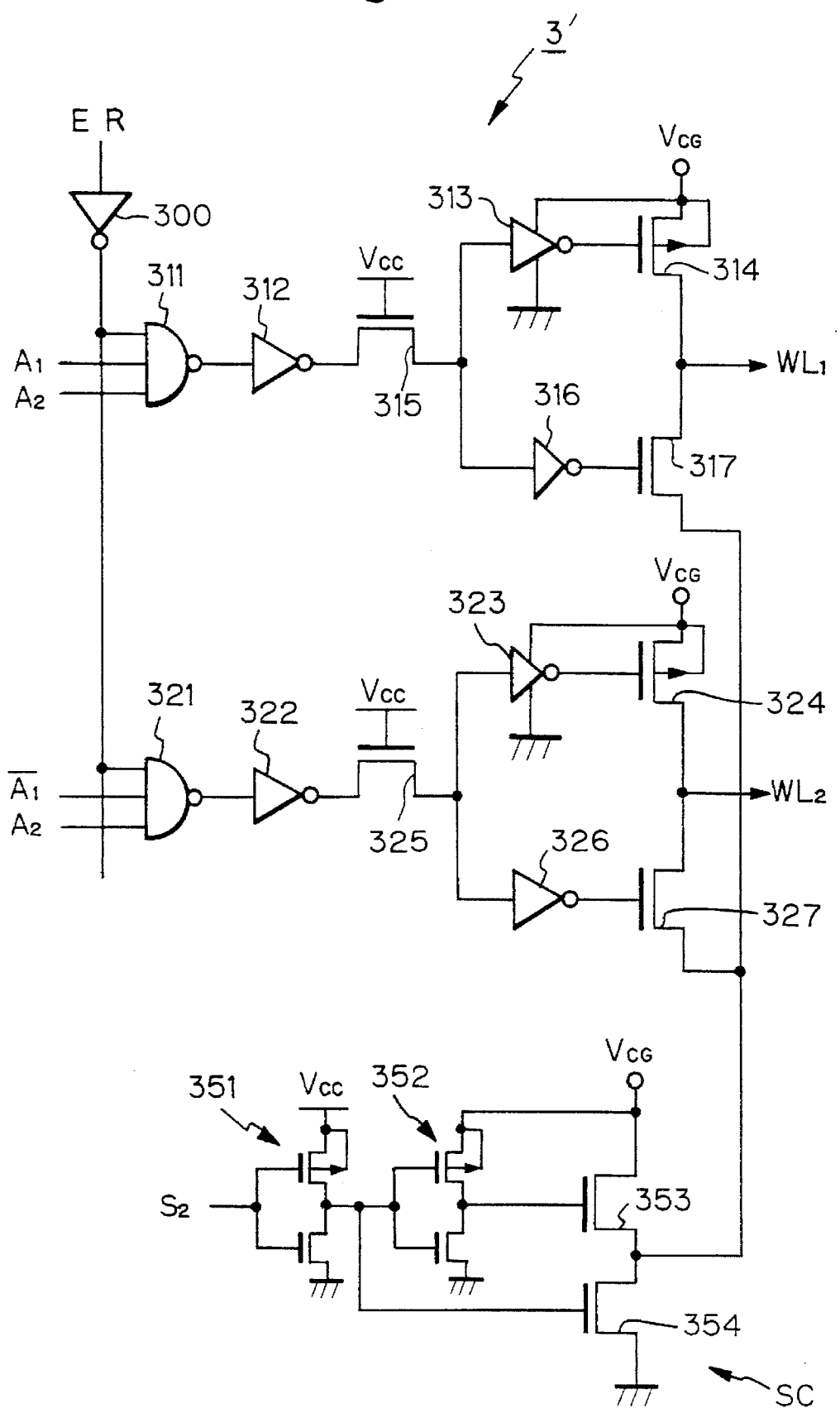
FIG. 20A is a circuit diagram of the row address decoder of FIG. 19.

In FIG. 20A, which is a detailed circuit diagram of the row address decoder 3' of FIG. 19, inverters 316, 326, ..., N-channel depletion-type transistors 317, 327, ..., are added to the elements of FIG. 5. Also, the sources of the transistors 317, 327, ... are connected to a source control circuit SC formed by an inverter 351 powered by the voltage $V_{CC}$, an inverter 352 powered by the voltage $V_{CG}$, an N-channel enhancement type transistor 353, and an N-channel enhancement type transistor 354. When the control signal $S_2$ is low, the transistor 354 turned ON, so that the sources of the transistors 317, 327, ... are grounded. Therefore, the circuit of FIG. 20A serves as the circuit of FIG. 5. On the contrary, when the control signal $S_2$ is high, the transistor 353 is turned ON, so that the sources of the transistors 317, 327, ... are at $V_{CG}$. Therefore, the voltages at the word lines $WL_1$, $WL_2$, $WL_3$ and $WL_4$ are $V_{CG}$.

Figure 20B:
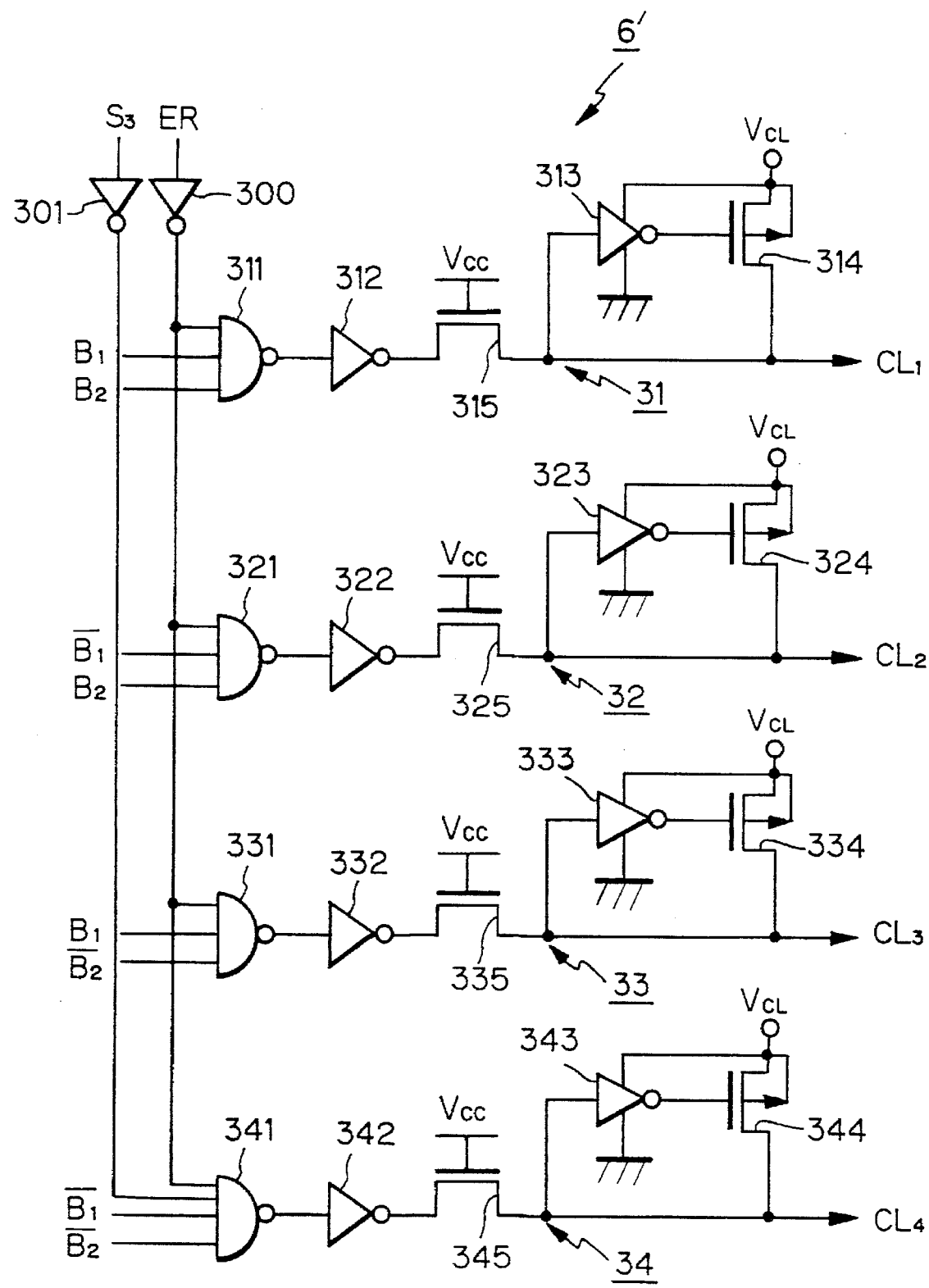
FIG. 20B is a circuit diagram of the column address decoder of FIG. 19.

In FIG. 20B, which is a detailed circuit diagram of the column address decoder 6' of FIG. 19, an inverter 301 for receiving the control signal $S_3$ is added to the elements of FIG. 5. When the control signal $S_3$ is low, the circuit of FIG. 20B serves as the circuit of FIG. 5. On the contrary, when the control signal S3 is high, the NAND circuits 311, 321, 331 and 341 are disabled so that the voltages at the column selection lines $C_1$, $CL_2$, $CL_3$ and $CL_4$ are grounded.

Figure 21:
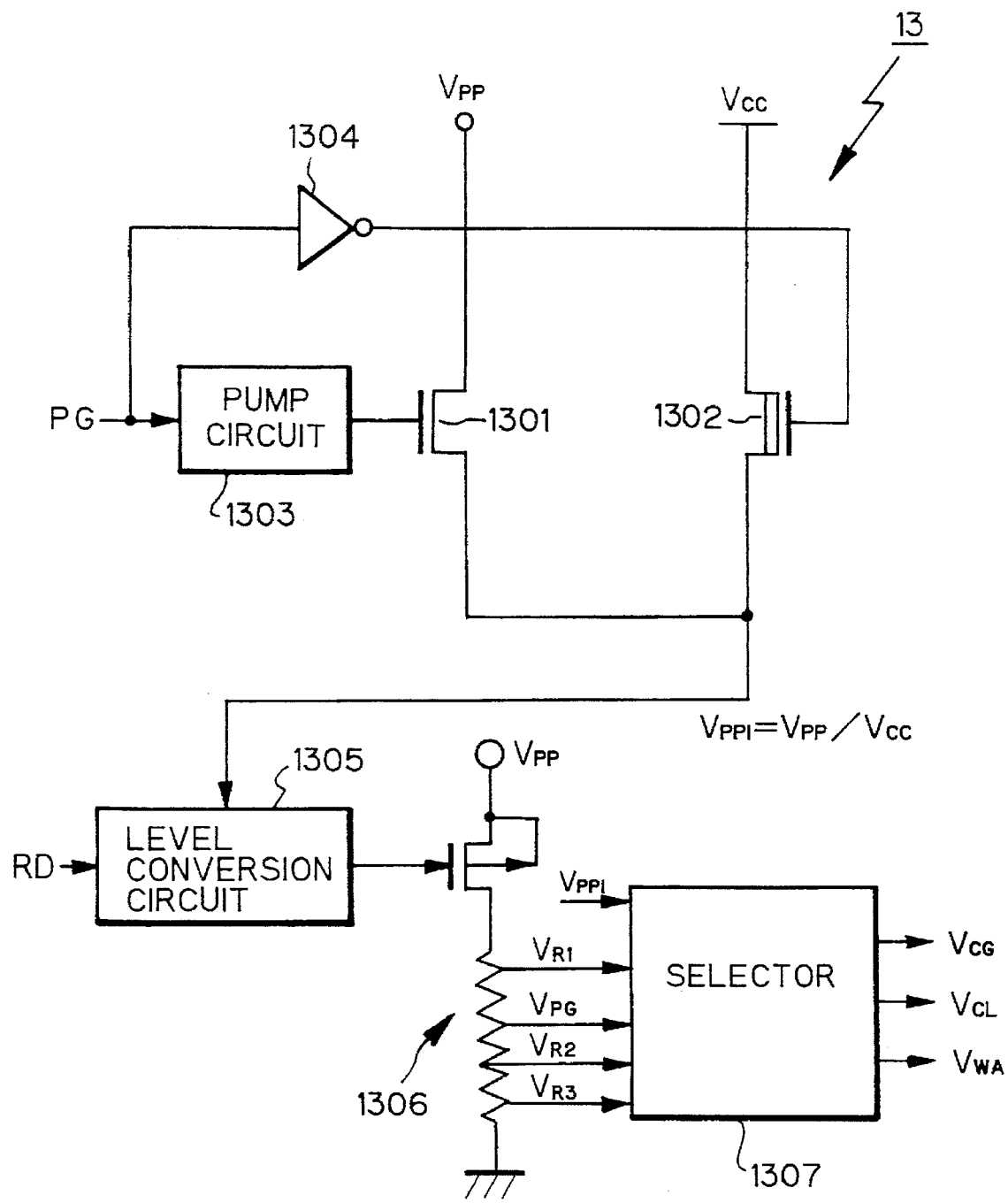
FIG. 21 is a circuit diagram of the voltage generating circuit of FIG. 19.

In FIG. 21, which is a detailed circuit diagram of the $V_{PP}/V_{CC}/V_{PG}/V_{DGV}/V_{ERV}/V_{DP}$ voltage generating circuit 13' of FIG. 19, the voltage divider 1306 generates a depletion verifying voltage $V_{DP}$, i.e., a third reference voltage $V_{R3}$. This depletion voltage $V_{DP}$ is a little higher than the ground GND. Also, the selector 1307 makes the voltage $V_{CG}$ equal $V_{DP}$ in a depletion verifying mode.

A second prior art erasing and verifying method using the device of FIG. 19 is explained with reference to FIG. 22.

At step 2201, a value N1 is initialized, i.e.,

N1←0.

Next, at step 2202, a write operation is performed upon all of the memory cells $C_{11}, C_{12}, \ldots, C_{44}$. In this case, the program signal PG, the control signal RD, the control signal DP and the erase signal ER are

PG="1"

RD="0"

DP="0"

ER="0".

Therefore, $V_{CG}=V_{PP}$. Also, the control signals $S_1$, $S_2$ and $S_3$ and the write data DI are $S_1$="1"

$S_2$="0"

$S_3$="0"

DI="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{PP}$ is applied to the control gate CG, and the voltage $V_{dd}$, which is lower than $V_{PP}$ by a threshold voltage of the column selection transistor such as $Q_{c1}$, is applied to the drain region D. Also, the source region S is grounded by the source circuit 2. When a write operation upon all the memory cells $C_{11}, C_{12}, \ldots, C_{44}$ is completed, the control proceeds to step 2203.

At step 2203, a write verification is carried out. That is, it is determined whether or not the threshold voltage of each memory cell is higher than the first reference voltage $V_{R1}$. For example, the first reference voltage $V_{R1}$ is $V_{R1}=V_{PGV}=7.5$ V.

In this case, the program signal PG, the program signal PG, the control signal RD, the control signal DP and the erase signal ER are

PG="0"

RD="1"

DP="0"

ER="0".

Therefore, $V_{CG=VPGV}$. Also, the control signals $S_1$, $S_2$ and $S_3$ are $S_1$="1"

$S_2$="0"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{PGV}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 2206. Otherwise, the control proceeds to steps 2204 and 2205.

Steps 2204 and 2205 repeat a write operation at step 2204 and a write verification at step 2205 within definite times defined by N1. That is, when the value N1 reaches $N1_o$, the control proceeds to a failure mode step 2211 which determines the device as a defective (unaccepted) one.

At step 2206, a flash erase operation is performed upon all of the memory cells $C_{11}, C_{12}, \ldots, C_{44}$, until all of the memory cells $C_{11}, C_{12}, \ldots, C_{44}$ enter a depletion state. In this case, the program signal PG, the control signal RD, the control signal DP and the erase signal ER are

PG="1"

RD="0"

DR="0"

ER="1".

Therefore, $V_{CG}=V_{PGV}$ ($=V_{R1}$). Also, the control signals $S_1$, $S_2$ and $S_3$ are $S_1$="0"

$S_2$="0"

$S_3$="0".

As a result, in the memory cells $C_{11}$, $C_{12}$, ..., $C_{44}$, the voltages at the sources are high (=$V_{PP}$), the voltages at the gates are 0 V, and the drains are in a floating state. This state is maintained for a relatively long time period, so that the electrons at the floating gates are expelled therefrom, so as to sufficiently reduce the threshold voltages of the memory cells. As a result, all of the memory cells enter a depletion state. Then, the control proceeds to step 2207.

At step 2207, a threshold voltage recovering operation as shown in FIG. 17 is carried out. In this case, the program signal PG, the control signal RD, the control signal DP and the erase signal ER are

PG="1"

RD="0"

DP="0"

ER="0".

Therefore, $V_{CG}=V_{PP}$. Also, the control signals $S_1$, $S_2$ and $S_3$ and the write data DI are $S_1$="0"

$S_2$="1"

$S_3$="1".

As a result, in the memory cells $C_{11}$, $C_{12}$, ..., $C_{44}$, the voltage $V_{PP}$ is applied to the gates of the memory cells by the row address decoder 3', and the sources of the memory cells are grounded by the source circuit 2. Also, the drains of the memory cells are put in a floating state by the column address decoder 6'.

Next, at step 2208, a verifying operation is carried out to determine whether or not the threshold voltage of each memory cell is higher than the third reference voltage $V_{R3}$ (=$V_{DP}$). In this case, the program signal PG, the control signal RD, the control signal DP and the erase signal ER are

PG="0"

RD="0"

DP="1"

ER="0".

Therefore, $V_{CG}=V_{DP}$. Also, the control signals $S_1$, $S_2$ and $S_3$ are $S_1$="0"

$S_2$="1"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{DP}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 2209. Otherwise, the control returns to step 2207.

The threshold voltage recovering operation at step 2206 is repeated until all the threshold voltages of the memory cells $C_{11}$, $C_{12}$, ..., $C_{44}$ are higher than the third reference voltage $V_{R3}$. Then, the control proceeds to step 2209.

At step 2209, an erase verification is carried out. That is, it is determined whether or not the threshold voltage of each memory cell is lower than the second reference voltage $V_{R2}$. For example, the second reference voltage $V_{R2}$ is $V_{R2}=V_{ERV}=3.5$ V.

In this case, the program signal PG, the control signal RD, the control signal DP and the erase signal ER are

PG="0"

RD="1"

DP="0"

ER="0".

Therefore, $V_{CG}=V_{ERV}$. Also, the control signals $S_1$, $S_2$ and $S_3$ are $S_1$="1"

$S_2$="0"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{R2}$ is applied to the control gate CG, while the source region S is grounded by the source circuit 2. Therefore, the data stored in the floating gate FG is output to the sense amplifier 11, and it is determined whether this data DO is "1". When all data of the memory cells are "1", the control proceeds to step 2210. Otherwise, the control proceeds to step 2211.

At step 2210, the device is determined as an accepted one. On the other hand, at step 2211, the device is determined as a defective (unaccepted) one.

Then, this routine is completed by step 2212.

Figure 22:
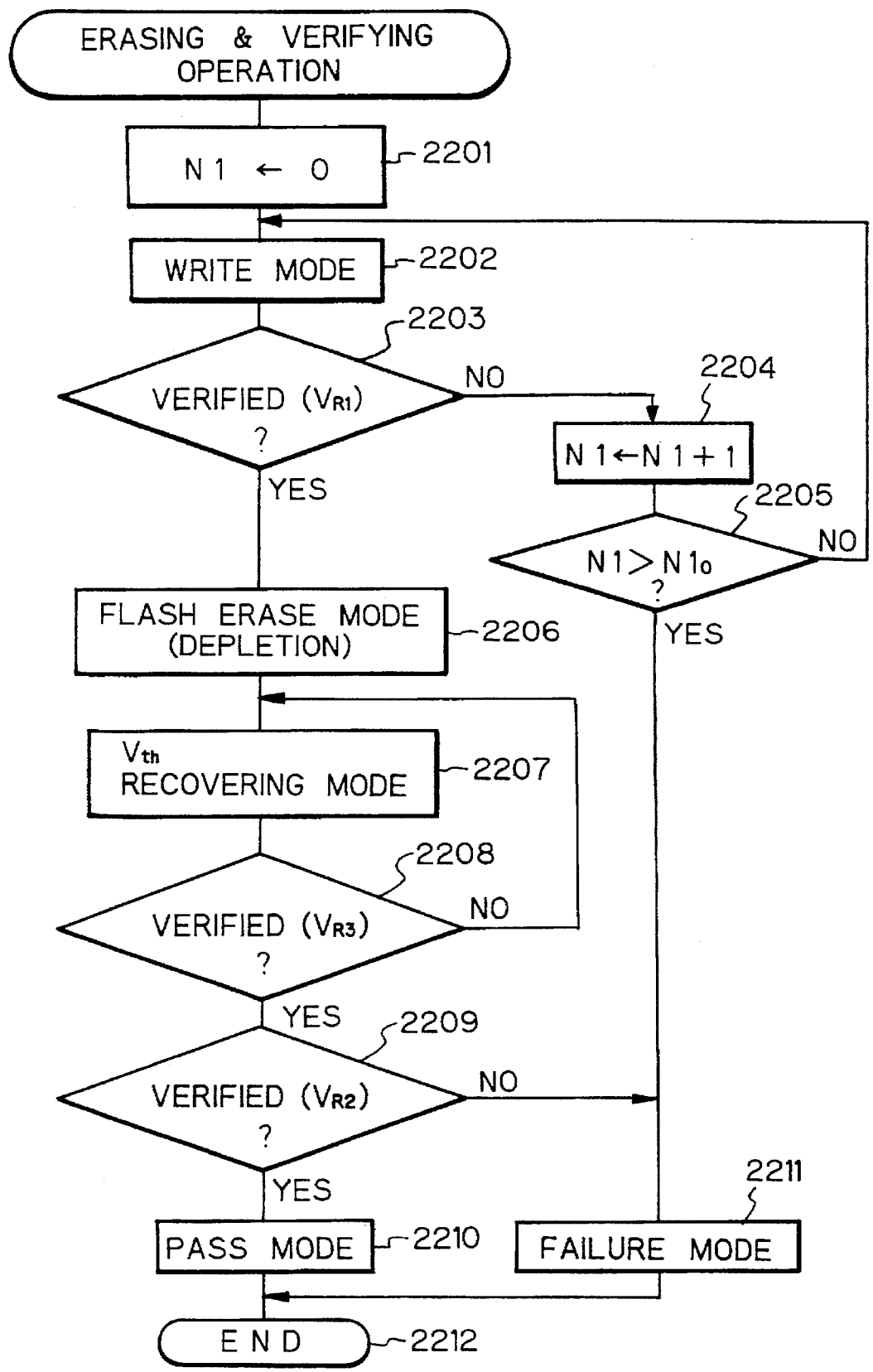
FIG. 22 is a flowchart showing the operation of the control circuit of FIG. 19 for carrying out the second prior art erasing and verifying method.
Figure 23A:
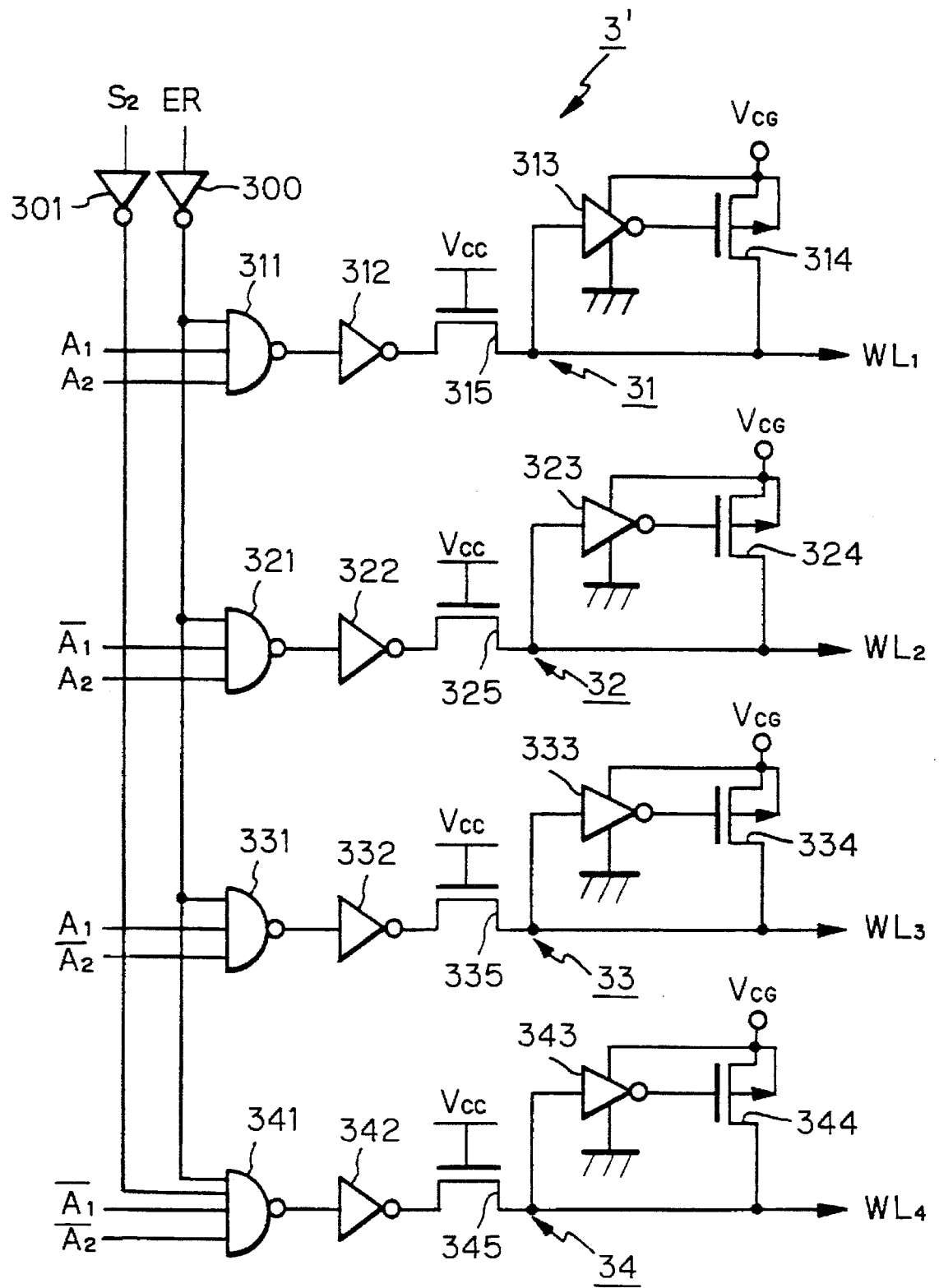
FIG. 23A is a modification of the circuit of FIG. 20A.
Figure 23B:
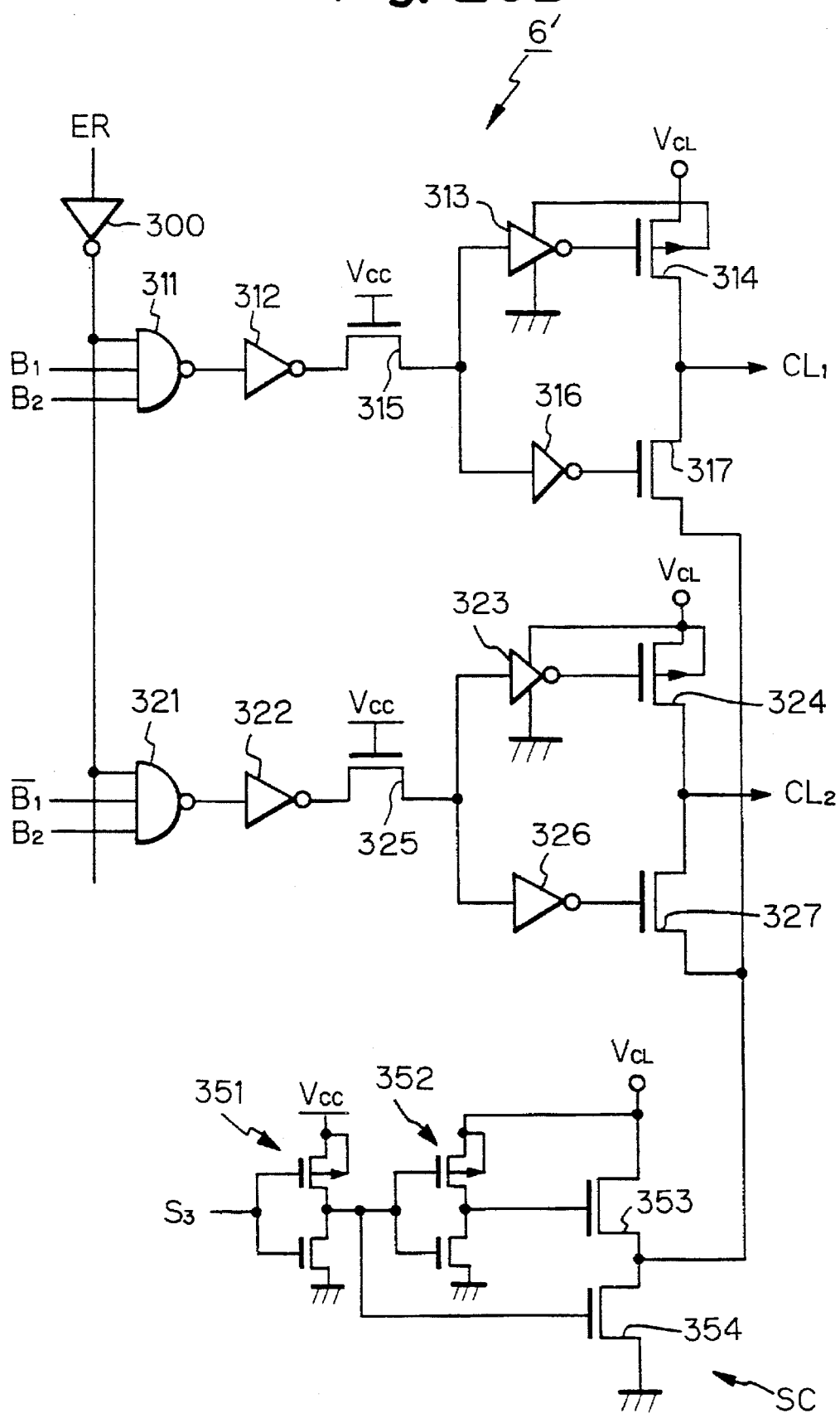
FIG. 23B is a modification of the circuit of FIG. 20B.

Note that, if the threshold voltage recovering operation as shown in FIGS. 18A and 18B is carried out at step 2207 of FIG. 22, the configuration of the row address decoder 3' is exchanged with that of the column address decoder 6'. In this case, the row address decoder 3' is illustrated in FIG. 23A, and the column address decoder 6' is illustrated in FIG. 23B.

In the second prior art erasing and verifying method as shown in FIG. 22, however, in spite of the enhancement/depletion state of the memory cells, the flash erase operation for putting the memory cells in a depletion state and the threshold voltage recovering operation at steps 2206, 2207 and 2208 are carried out, to increase the time required for erasing and verifying the flash memory device.

Embodiments of the present invention will be explained with reference to FIGS. 24A, 24B, 25A, 25B, 26A, 26B, 27A, 27B, 28A and 28B.

Figure 24A:
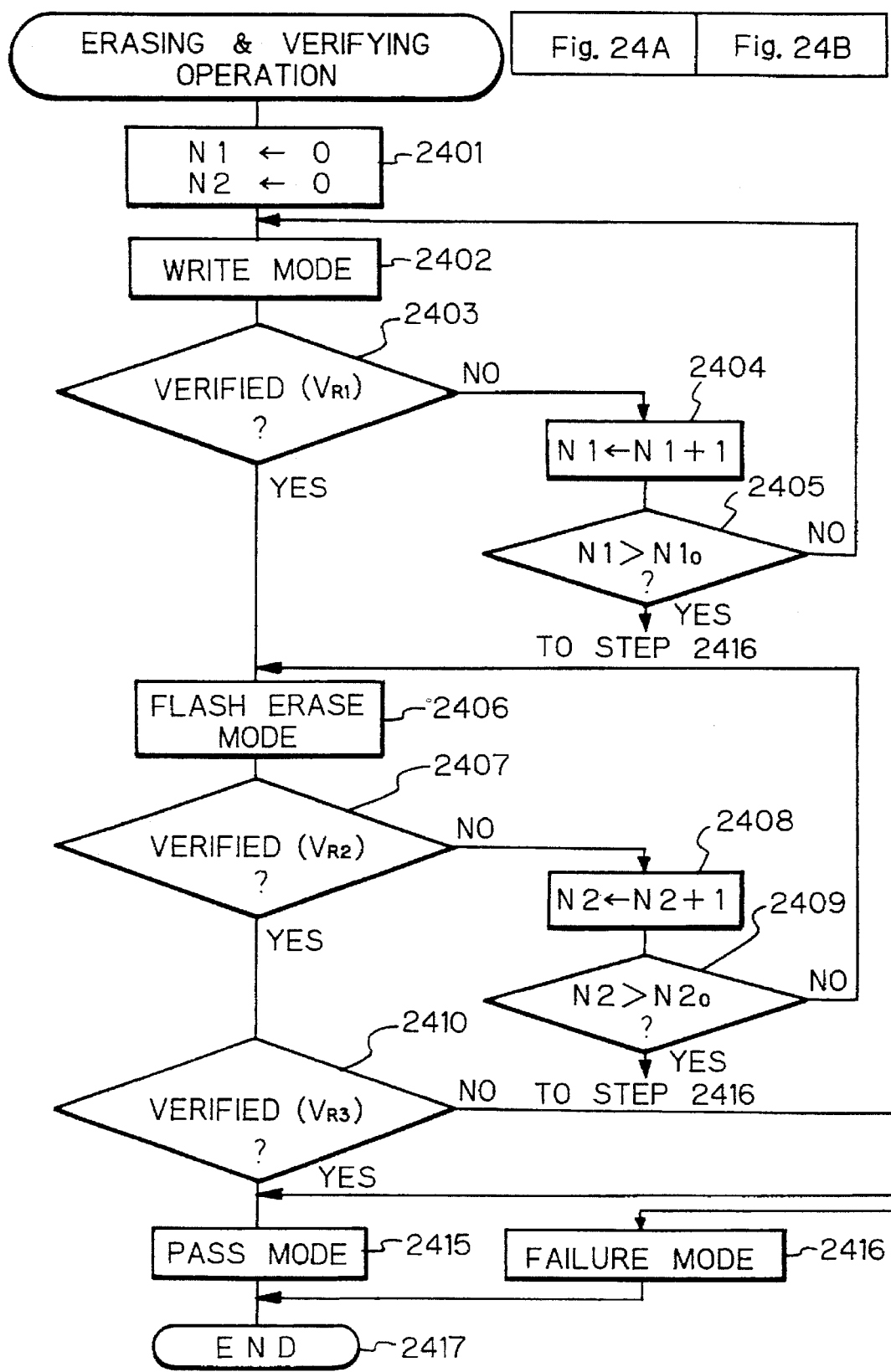
FIGS. 24A and 24B are flowcharts showing the operation of the control circuit of FIG. 19 for carrying out a first embodiment of the erasing and verifying method according to the present invention.
Figure 24B:
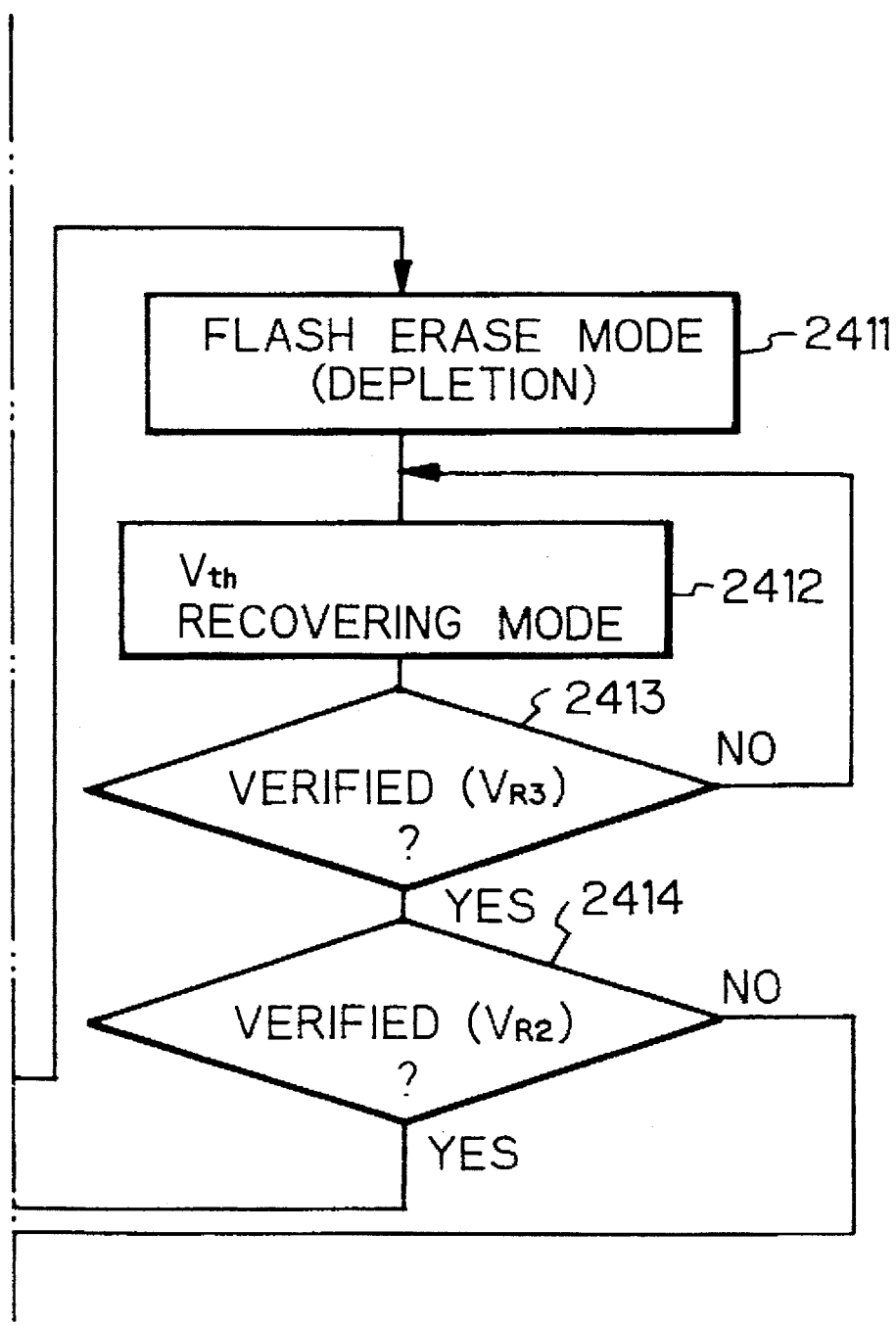

Referring to FIGS. 24A and 24B, which show a first embodiment of the present invention, at step 2401, values N1 and N2 are initialized, i.e.,

N1←0

N2←0.

Next, at step 2402, in the same way as at step 2202 of FIG. 22, a write operation is performed upon all of the memory cells $C_{11}$, $C_{12}$, ..., $C_{44}$. In this case, the program signal PG, the control signal RD, the control signal DP and the erase signal ER are

PG="1"

RD="0"

DP="0"

ER="0".

Therefore, $V_{CG}=V_{PP}$. Also, the control signals $S_1$, $S_2$ and $S_3$ and the write data DI are $S_1$="1"

$S_2$="0"

$S_3$="0"

DI="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{PP}$ is applied to the control gate CG, and the voltage $V_{dd}$, which is lower than $V_{PP}$ by a threshold voltage of the column selection transistor such as $Q_{c1}$, is applied to the drain region D. Also, the source region S is grounded by the source circuit 2. When a write operation upon all the memory cells $C_{11}$, $C_{12}$, ..., $C_{44}$ is completed, the control proceeds to step 2403.

At step 2403, in the same way as at step 2203 of FIG. 22, a write verification is carried out. That is, it is determined whether or not the threshold voltage of each memory cell is higher than the first reference voltage $V_{R1}$ (=$V_{PGV}$). In this case, the program signal PG, the program signal PG, the control signal RD, the control signal DP and the erase signal ER are

PG="0"

RD="1"

DP="0"

ER="0".

Therefore, $V_{CG}=V_{PGV}$. Also, the control signals $S_1$, $S_2$ and $S_3$ are $S_1$="1"

$S_2$="0"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{PGV}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 2406. Otherwise, the control proceeds to steps 2404 and 2405.

Steps 2404 and 2405 repeat the write operation at step 2404 and the write verification at step 2405 within definite times defined by $N1_o$. That is, when the value N1 reaches $N1_o$, the control proceeds to a failure mode step 2416 which determines the device as a defective (unaccepted) one.

At step 2406, a flash erase operation is performed upon all of the memory cells $C_{11}$, $C_{12}$, ..., $C_{44}$. In this case, the program signal PG, the control signal RD, the control signal DP and the erase signal ER are

PG="1"

RD="0"

DP="0"

ER="1".

Therefore, $V_{CG}=V_{PP}$. Also, the control signals $S_1$, $S_2$ and $S_3$ are $S_1$="0"

$S_2$="0"

$S_3$="0".

As a result, in the memory cells $C_{11}$, $C_{12}$, ..., $C_{44}$, the voltages at the sources are high (=$V_{PP}$), the voltages at the gates are 0 V, and the drains are in a floating state. This state is maintained for a relatively short time period, so that the electrons at the floating gates are expelled therefrom, so as to reduce the threshold voltages of the memory cells. Then, the control proceeds to step 2407.

At step 2407, an erase verification is carried out. That is, it is determined whether or not the threshold voltage of each memory cell is lower than the second reference voltage $V_{R2}$ (=$V_{ERV}$). In this case, the program signal PG, the control signal RD, the control signal DP and the erase signal ER are

PG="0"

RD="1"

DP="0"

ER="0".

Therefore, $V_{CG}=V_{ERV}$. Also, the control signals $S_1$, $S_2$ and $S_3$ are $S_1$="1"

$S_2$="0"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{ERV}$ is applied to the control gate CG, while the source region S is grounded by the source circuit 2. Therefore, the data stored in the floating gate FG is output to the sense amplifier 11, and it is determined whether this data DO is "1". When all data of the memory cells are "1", the control proceeds to step 2410. Otherwise, the control proceeds to step 2408 and 2409.

Steps 2408 and 2409 repeat the flash erase operation at step 2406 and the erase verification at step 2406 within definite times defined by $N2_o$. That is, when the value N2 reaches $N2_o$, the control proceeds to the failure mode step 2416 which determines the device as a defective (unaccepted) one.

Next, at step 2410, a verifying operation is carried out to determine whether or not the threshold voltage of each memory cell is higher than the third reference voltage $V_{R3}$ (=$V_{DP}$). In this case, the program signal PG, the control signal RD, the control signal DP and the erase signal ER are

PG="0"

RD="0"

DP="1"

ER="0".

Therefore, $V_{CG}=V_{DP}$. Also, the control signals $S_1$, $S_2$ and $S_3$ are $S_1$="0"

$S_2$="1"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{DP}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 2415. Otherwise, the control returns to step 2411.

At step 2411, a flash erase operation is performed upon all of the memory cells $C_{11}$, $C_{12}$, ..., $C_{44}$, until all of the memory cells $C_{11}$, $C_{12}$, ..., $C_{44}$ enter a depletion state. In this case, the program signal PG, the control signal RD, the control signal DP and the erase signal ER are

PG="1"

RD="0"

DP="0"

DP="0".

Therefore, $V_{CG}=V_{PP}$. Also, the control signals $S_1$, $S_2$ and $S_3$ are $S_1$="0"

$S_2$="0"

$S_3$="0".

As a result, in the memory cells $C_{11}$, $C_{12}$, ..., $C_{44}$, the voltages at the sources are high (=$V_{PP}$), the voltages at the gates are 0 V, and the drains are in a floating state. This state is maintained for a relatively long time period, so that the electrons at the floating gates are expelled therefrom, so as to sufficiently reduce the threshold voltages of the memory cells. As a result, all of the memory cells enter a depletion state. Then, the control proceeds to step 2412.

At step 2412, a threshold voltage recovering operation as shown in FIG. 17 is carried out. In this case, the program signal PG, the control signal RD, the control signal DP and the erase signal ER are

PG="1"

RD="0"

DP="0"

ER="0".

Therefore, $V_{CG}=V_{PP}$. Also, the control signals $S_1$, $S_2$ and $S_3$ and the write data DI are $S_1$="0"

$S_2$="1"

$S_3$="1"

DI="0".

As a result, in the memory cells $C_{11}$, $C_{12}$, ..., $C_{44}$, the voltage $V_{PP}$ is applied to the gates of the memory cells by the row address decoder 3', and the sources of the memory cells are grounded by the source circuit 2. Also, the drains of the memory cells are put in a floating state by the column address decoder 6'.

Next, at step 2413, a verifying operation is carried out to determine whether or not the threshold voltage of each memory cell is higher than the third reference voltage $V_{R3}$ (=$V_{DP}$). In this case, the program signal PG, the control signal RD, the control signal DP and the erase signal ER are

PG="0"

RD="0"

DP="1"

ER="0".

Therefore, $V_{CG}=V_{DP}$. Also, the control signals $S_1$, $S_2$ and $S_3$ are $S_1$="0"

$S_2$="1"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{DP}$ is applied to the control gate CG, while the source region S is grounded by the source circuit 2. Therefore, the data stored in the floating gate FG is output to the sense amplifier 11, and it is determined whether this data DO is "0". When all data of the memory cells are "0", the control proceeds to step 2414. Otherwise, the control returns to step 2412.

The threshold voltage recovering operation at step 2412 is repeated until all the threshold voltages of the memory cells $C_{11}$, $C_{12}$, ..., $C_{44}$ are higher than the third reference voltage $V_{R3}$. Then, the control proceeds to step 2414.

At step 2414, an erase verification is carried out. That is, it is determined whether or not the threshold voltage of each memory cell is lower than the second reference voltage $V_{R2}$ (=$V_{ERV}$). In this case, the program signal PG, the control signal RD, the control signal DP and the erase signal ER are

PG="0"

RD="1"

DP="0"

ER="0".

Therefore, $V_{CG}=V_{ERV}$. Also, the control signals $S_1$, $S_2$ and $S_3$ are $S_1$="1"

$S_2$="0"

$S_3$="0".

In this state, an internal address defined by ($IA_1$, $IA_2$, $IB_1$, $IB_2$) is changed from (0, 0, 0, 0) to (1, 1, 1, 1). As a result, in a memory cell selected by the internal address, the voltage $V_{ERV}$ is applied to the control gate CG, while the source region S is grounded by the source circuit 2. Therefore, the data stored in the floating gate FG is output to the sense amplifier 11, and it is determined whether this data DO is "1". When all data of the memory cells are "1", the control proceeds to step 2415. Otherwise, the control proceeds to step 2416.

At step 2415, the device is determined as an accepted one. On the other hand, at step 2416, the device is determined as a defective (unaccepted) one.

Then, this routine is completed by step 2417.

Also, note that, if the threshold voltage recovering operation as shown in FIGS. 18A and 18B is carried out at step 2412 of FIG. 24, the configuration of the row address decoder 3' is exchanged with that of the column address decoder 6', as illustrated in FIGS. 23A and 23B.

Thus, in the first embodiment, only when it is determined at step 2410 there is at least one depletion state memory cell, are the flash erase operation for making the memory cells in a depletion state and the threshold voltage recovering operation at steps 2411, 2412 and 2413 carried out, to remarkably reduce the time required for erasing and verifying the flash memory device.

Figure 25A:
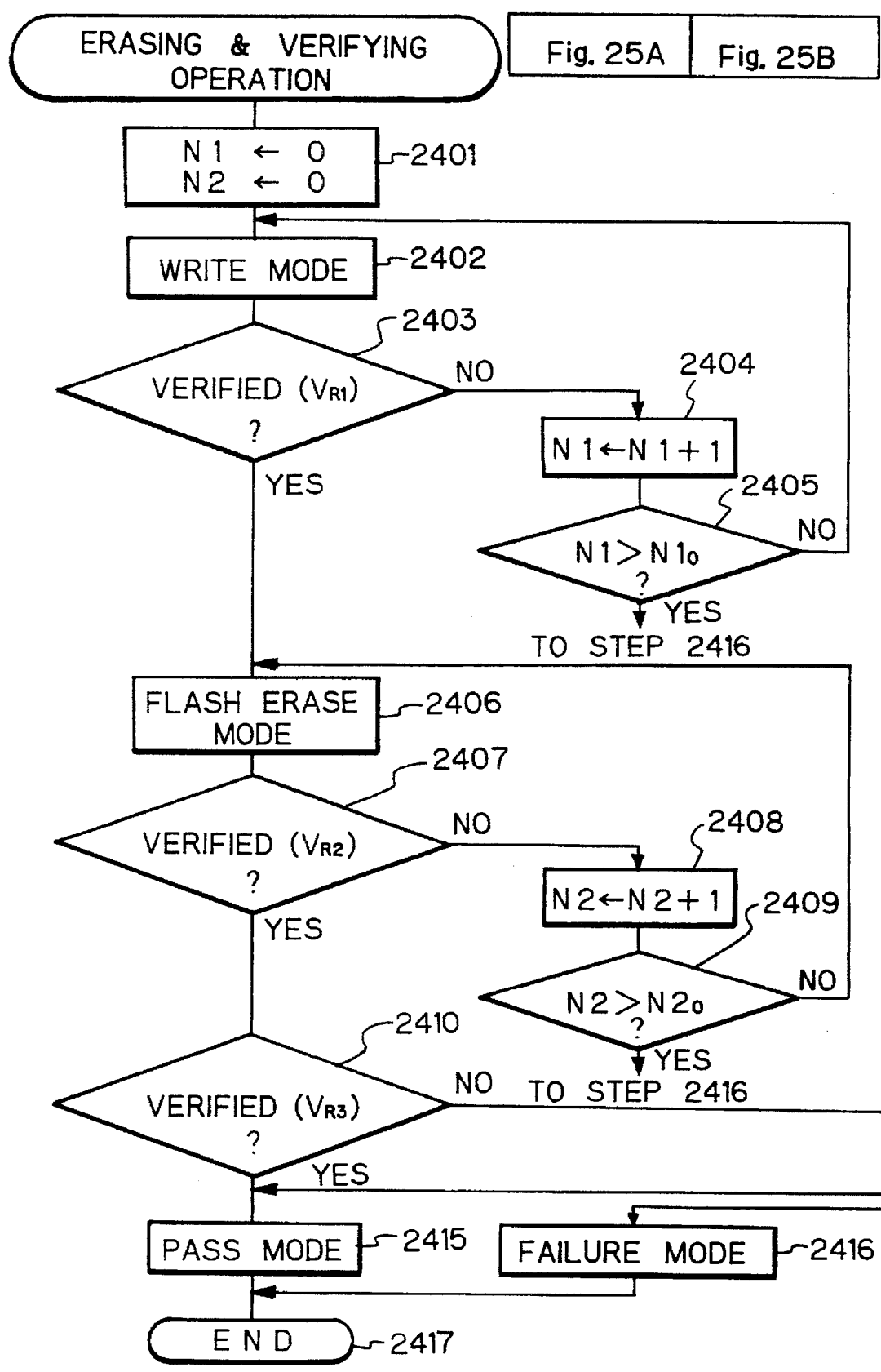
FIGS. 25A and 25B are flowcharts showing the operation of the control circuit of FIG. 19 for carrying out a second embodiment of the erasing and verifying method according to the present invention.
Figure 25B:
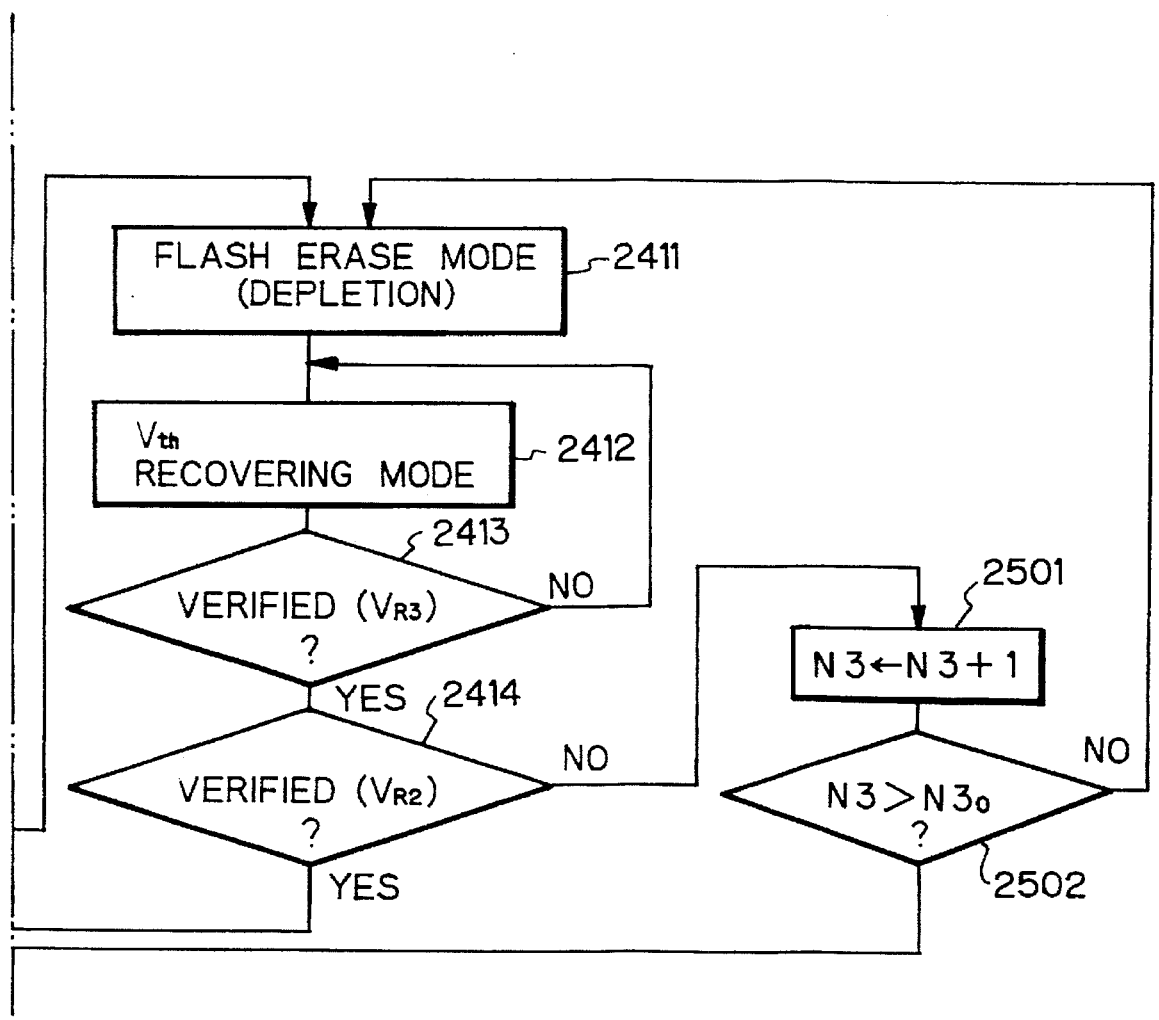

Referring to FIGS. 25A and 25B, which shows a second embodiment of the present invention, steps 2501 and 2502 are added to the steps of FIG. 24. That is, at step 2414, when it is determined that the threshold voltage of at least one memory cell is not lower than the second reference voltage $V_{R2}$, the control proceeds to steps 2501 and 2502.

Steps 2501 and 2502 repeat the flash erase operation at step 2411, the threshold voltage recovering operation at step 2412, and the verifications at steps 2413 and 2414 within definite times $N3_o$, to further reduce the deviation of threshold voltage, i.e., to further converge the threshold voltage. Then, when the value N3 reaches $N3_o$, the control proceeds to the failure mode step 2416 which determines the device as a defective (unaccepted) one.

Figure 26A:
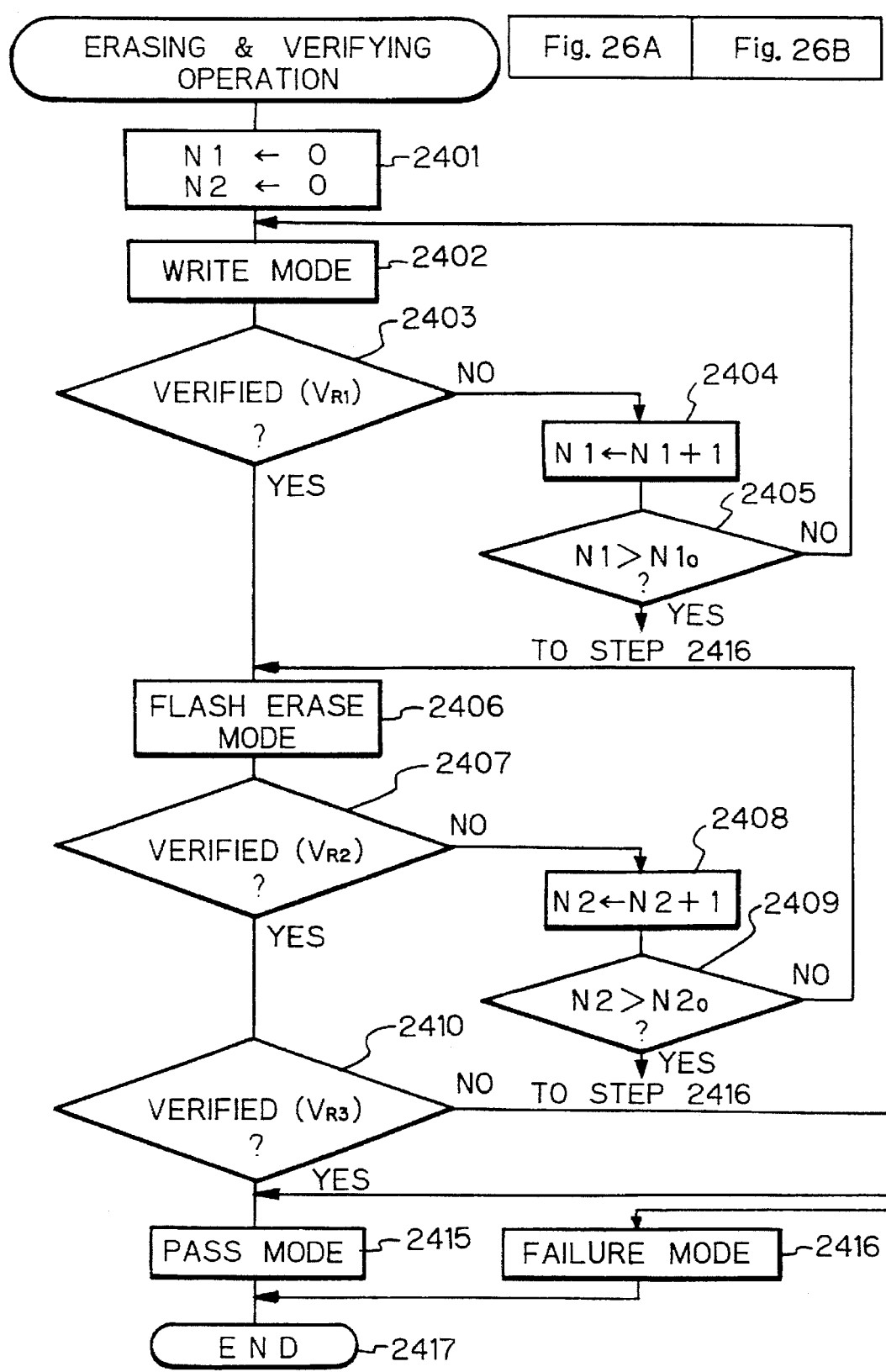
FIGS. 26A and 26B are flowchart showing the operation of the control circuit of FIG. 19 for carrying out a third embodiment of the erasing and verifying method according to the present invention.
Figure 26B:
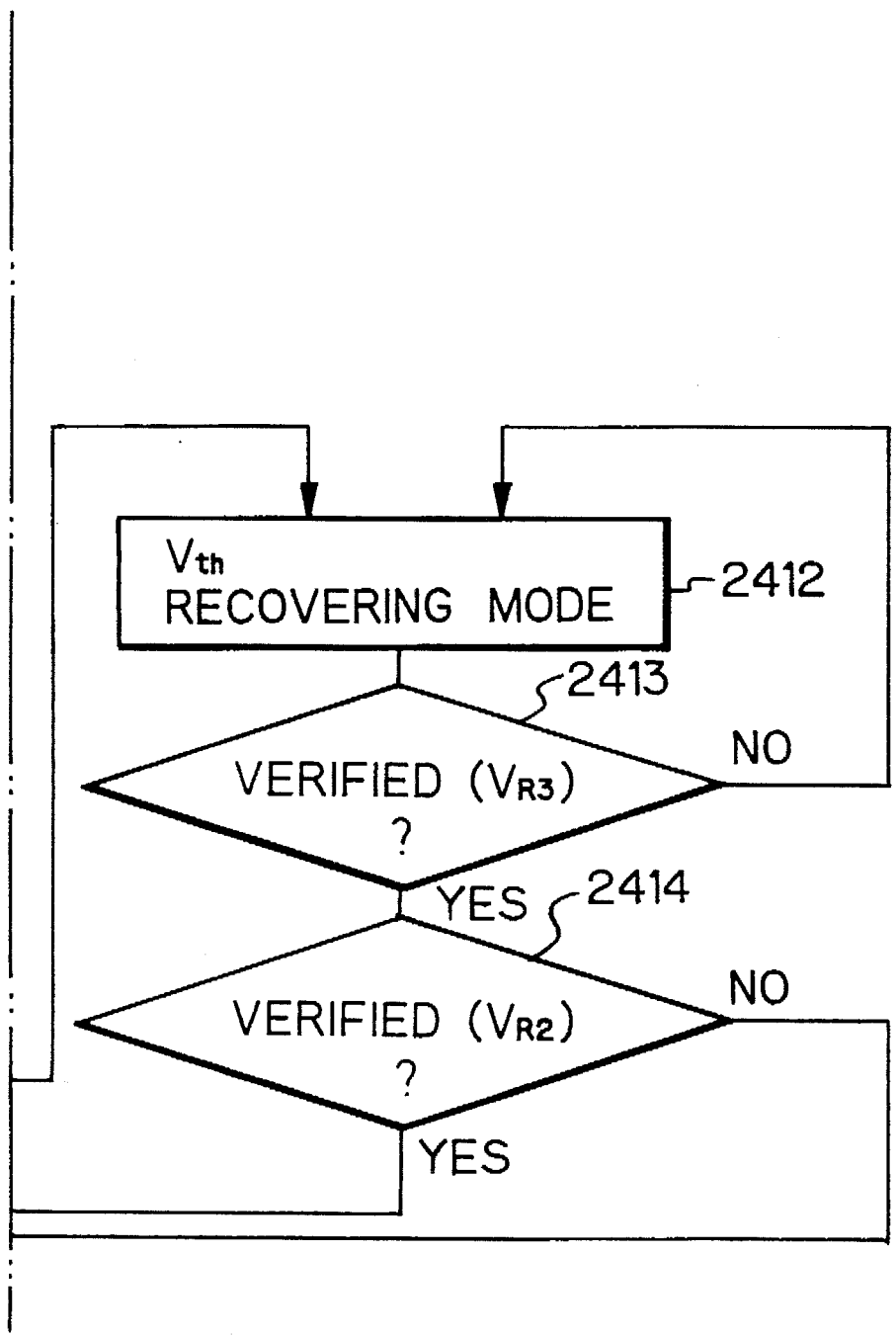

Referring to FIGS. 26A and 26B which show a third embodiment of the present invention, step 2411 of FIG. 24 is deleted. That is, even when there are some depletion state memory cells, the threshold voltage recovering operation at step 2412 is carried out without carrying out the flash erase operation for a depletion state, since the threshold voltage recovering operation per se has a function of converging the threshold voltage.

Figure 27A:
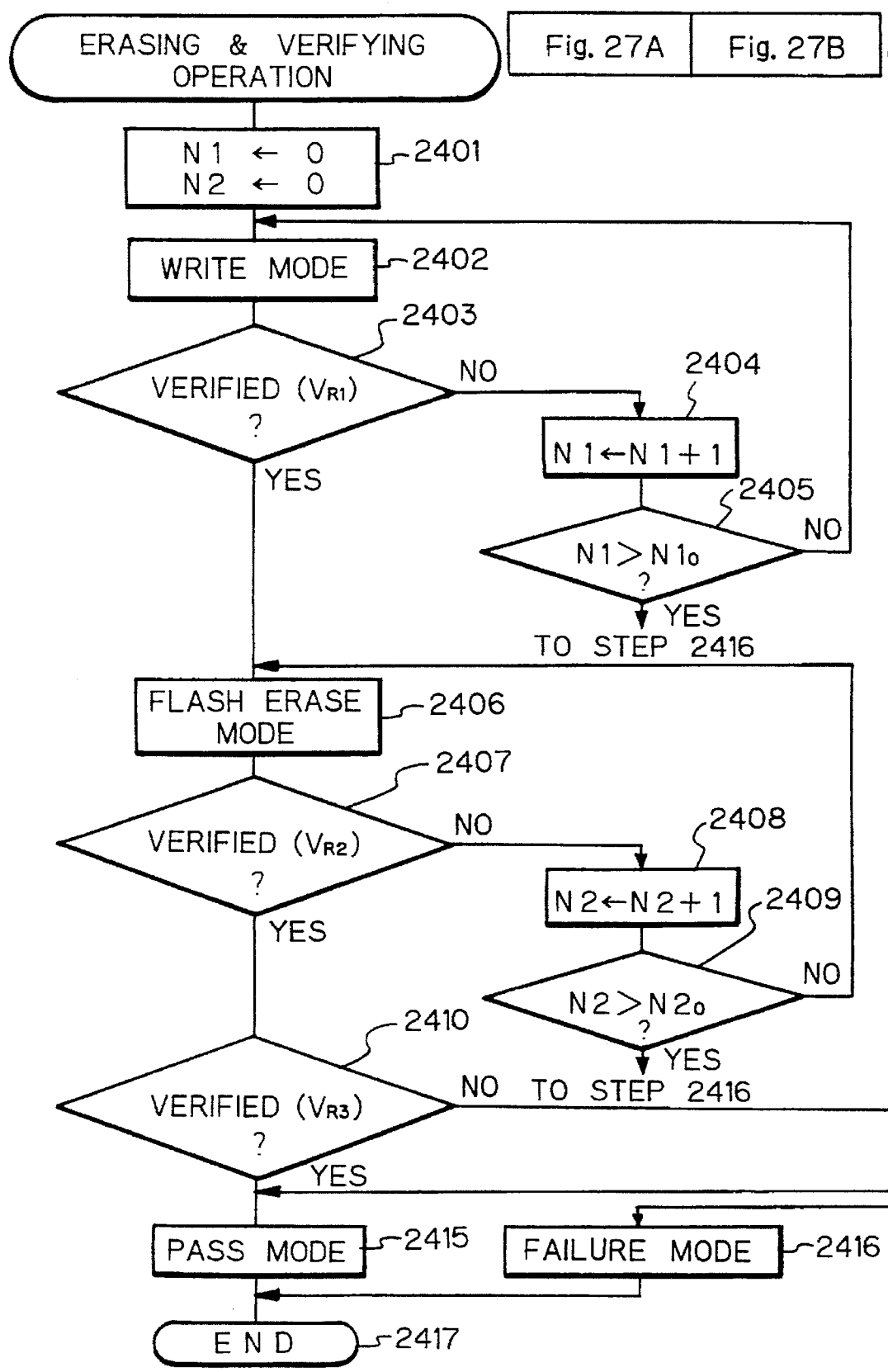
FIGS. 27A and 27B are flowcharts showing the operation of the control circuit of FIG. 19 for carrying out a fourth embodiment of the erasing and verifying method according to the present invention.
Figure 27B:
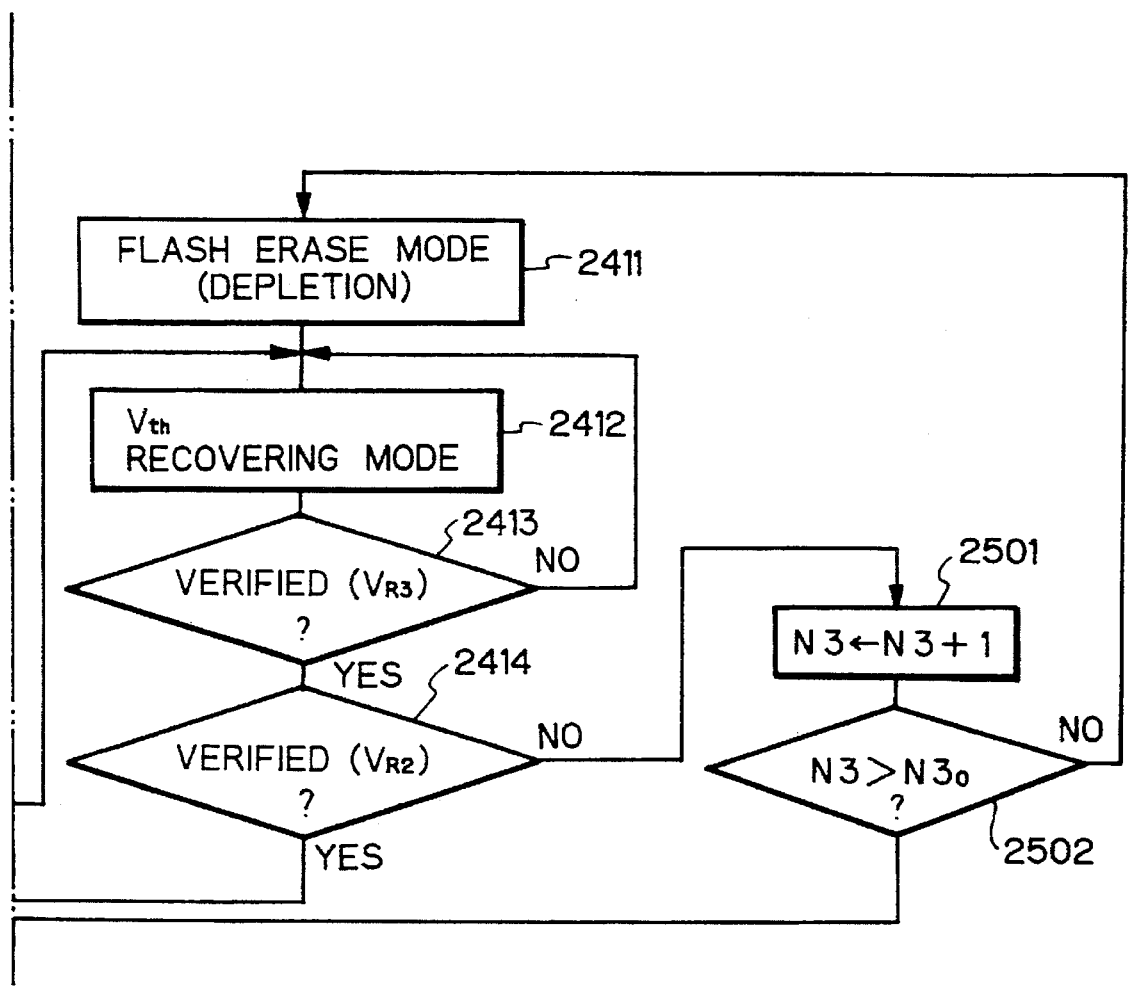

Referring to FIGS. 27A and 27B, which shows a fourth embodiment of the present invention, when the determination at step 2410 of FIGS. 25A and 25B is negative, the control proceeds directly to step 2412. That is, even when there are some of depletion state memory cells, the threshold voltage recovering operation at step 2412 is carried out without carrying out the flash erase operation for a depletion state at step 2411, since the threshold voltage recovering operation per se has a function of converging the threshold voltage.

Figure 28B:
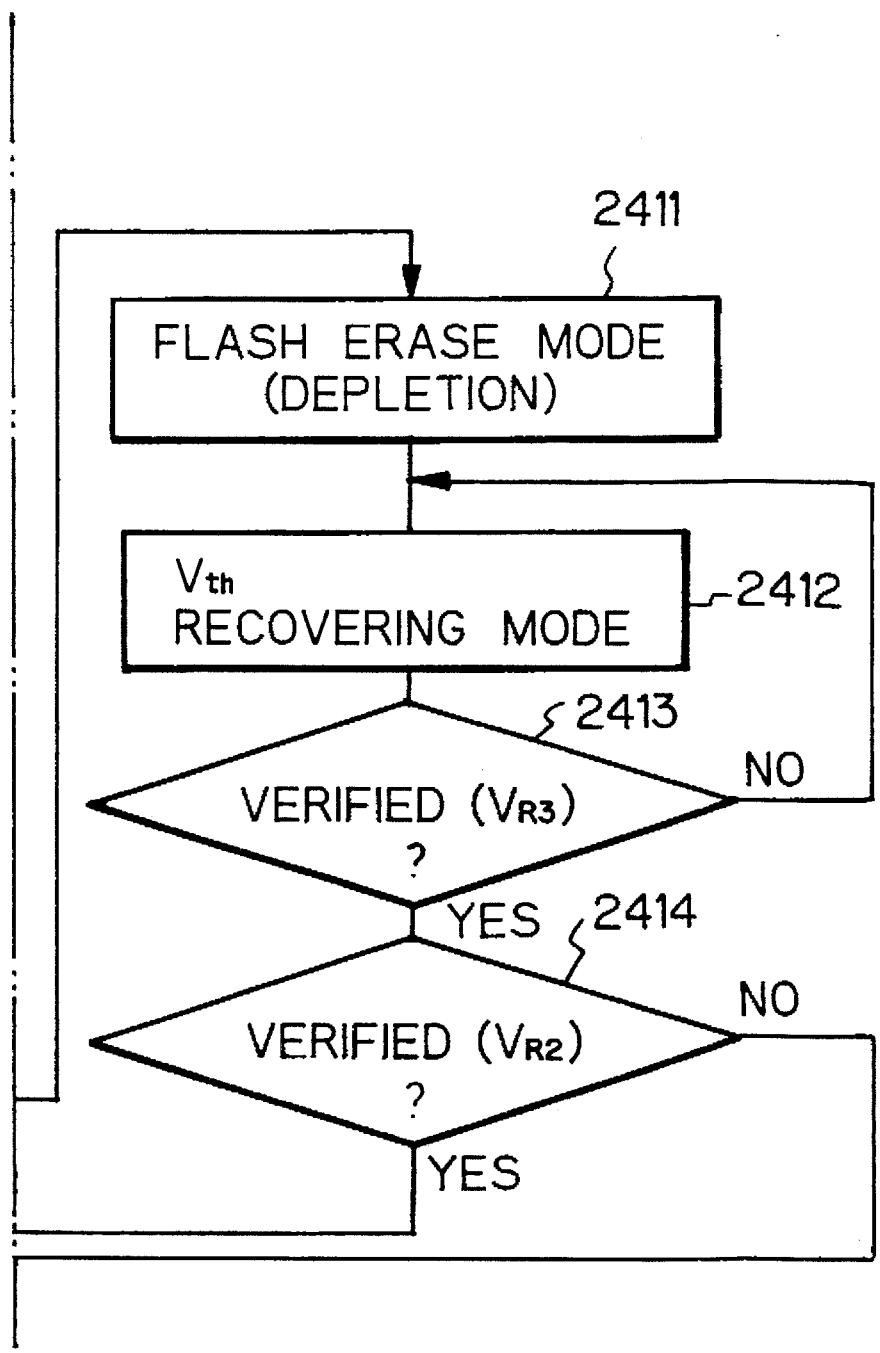

Referring to FIGS. 28A and 28B, which show a fifth embodiment of the present invention, when the determination at steps 2401 through 2405 of FIG. 24 is omitted. Note that, even in FIGS. 25A, 25B, 26, 27A and 27B, steps 2401 through 2405 can be omitted.

As explained hereinbefore, according to the present invention, only when it is determined there is at least one depletion state memory cell, is the threshold voltage recovering operation carried out, to remarkably reduce the time required for erasing and verifying the flash memory device.

I claim:

1. A method for erasing and verifying a nonvolatile semiconductor memory device including nonvolatile memory cells, comprising the steps of:

a) performing a write operation upon a certain number of said nonvolatile memory cells;

b) determining whether or not said write operation is carried out normally;

c) performing a flash erase operation upon said certain number of said nonvolatile memory cells after said write operation is carried out normally;

d) determining whether or not said flash erase operation is carried out normally;

e) determining whether or not at least one of said certain number of said nonvolatile memory cells is in a depletion state after said flash erase operation is carried out normally;

f) performing a threshold voltage recovering operation upon said certain number of said nonvolatile memory cells until all of said certain number of said nonvolatile memory cells enter an enhancement state only after at least one of said certain number of said nonvolatile memory cells is determined to be in a depletion state;

g) determining whether or not said certain number of said nonvolatile memory cells are in an erase completion state after said threshold voltage recovering operation is carried out; and h) determining said nonvolatile semiconductor memory device as a defective device when at least one of said nonvolatile memory cells is in a non-erase completion state.

2. A method as set forth in claim 1, further comprising the steps of:

i) performing a flash erase operation upon said certain number of said nonvolatile memory cells until all of said certain number of said nonvolatile memory cells enter a depletion state after at least one of said certain number of said nonvolatile memory cells is determined to be in a depletion state; and j) repeating said steps f) to h) after said step i) is carried out.

3. A method as set forth in claim 2, further comprising a step of repeating said steps i) and j) within a definite number of times.

4. A method as set forth in claim 1, further comprising a step of k) repeating said step a) after said write operation is not carried out normally.

5. A method as set forth in claim 4, further comprising a step of repeating said step k) within a definite number of times.

6. A method as set forth in claim 1, further comprising a step of l) repeating said step c) after said flash erase operation is not carried out normally.

7. A method as set forth in claim 6, further comprising a step of repeating said step l) within a definite number of times.

8. A method for erasing and verifying a nonvolatile semiconductor memory device including nonvolatile memory cells, comprising the steps of:

a) performing a write operation upon a certain number of said nonvolatile memory cells;

b) determining whether or not said write operation is carried out normally;

c) performing a flash erase operation upon said certain number of said nonvolatile memory cells after said write operation is carried out normally;

d) determining whether or not said flash erase operation is carried out normally;

e) determining whether or not at least one of said certain number of said nonvolatile memory cells is in a depletion state after said flash erase operation is carried out normally;

f) performing a flash erase operation upon said certain number of said nonvolatile memory cells until all of said certain number of said nonvolatile memory cells enter a depletion state only after at least one of said certain number of said nonvolatile memory cells is determined to be in a depletion state; and g) performing a threshold voltage recovering operation upon said certain number of said nonvolatile memory cells until all of said certain number of said nonvolatile memory cells enter an enhancement state after said flash erase operation in step f) is carried out;

h) determining whether or not said certain number of said nonvolatile memory cells are in an erase completion state after said threshold voltage recovering operation is carried out; and i) determining said nonvolatile semiconductor memory device as a defective device when at least one of said nonvolatile memory cells is in a non-erase completion state.

9. A method as set forth in claim 8, further comprising a step of j) repeating said steps d) to i) after said nonvolatile semiconductor memory device is determined to be a defective device.

10. A method as set forth in claim 9, further comprising a step of repeating said step l) within a definite number of times.

11. A method as set forth in claim 8, further comprising a step of m) repeating said step a) after said write operation is not carried out normally.

12. A method as set forth in claim 11, further comprising a step of repeating said step m) within a definite number of times.

13. A method as set forth in claim 8, further comprising a step of n) repeating said step c) after said flash erase operation is not carried out normally.

14. A method as set forth in claim 13, further comprising a step of repeating said step n) within a definite number of times.

15. A method for erasing and verifying a nonvolatile semiconductor memory device including nonvolatile memory cells, comprising the steps of:

a) performing a flash erase operation upon a certain number of said nonvolatile memory cells;

b) determining whether or not said flash erase operation is carried out normally;

c) determining whether or not at least one of said certain number of said nonvolatile memory cells is in a depletion state after said flash erase operation is carried out normally;

d) performing a threshold voltage recovering operation upon said certain number of said nonvolatile memory cells until all of said certain number of said nonvolatile memory cells enter an enhancement state only after at least one of said certain number of said nonvolatile memory cells is determined to be in a depletion state;

e) determining whether or not said certain number of said nonvolatile memory cells are in an erase completion state after said threshold voltage recovering operation is carried out; and f) determining said nonvolatile semiconductor memory device as a defective device when at least one of said nonvolatile memory cells is in a non-erase depletion state.

16. A method as set forth in claim 15, further comprising the steps of:

g) performing a flash erase operation upon said certain number of said nonvolatile memory cells until all of said certain number of said nonvolatile memory cells enter a depletion state after at least one of said certain number of said nonvolatile memory cells is determined to be in a depletion state; and h) repeating said steps d) to f) after said step g) is carried out.

17. A method as set forth in claim 16, further comprising a step of repeating said steps g) and h) within a definite number of times.

18. A method as set forth in claim 15, further comprising a step of i) repeating said step a) after said write operation is not carried out normally.

19. A method as set forth in claim 18, further comprising a step of repeating said step i) within a definite number of times.

20. A method for erasing and verifying a nonvolatile semiconductor memory device including nonvolatile memory cells, comprising the steps of:

a) performing a flash erase operation upon a certain number of said nonvolatile memory cells;

b) determining whether or not said flash erase operation is carried out normally;

c) determining whether or not at least one of said certain number of said nonvolatile memory cells is in a depletion state after said flash erase operation is carried out normally;

d) performing a flash erase operation upon said certain number of said nonvolatile memory cells until all of said certain number of said nonvolatile memory cells enter a depletion state only after at least one of said certain number of said nonvolatile memory cells is determined to be in a depletion state; and e) performing a threshold voltage recovering operation upon said certain number of said nonvolatile memory cells until all of said certain number of said nonvolatile memory cells enter an enhancement state after said flash erase operation in step d) is carried out;

f) determining whether or not said certain number of said nonvolatile memory cells are in an erase depletion state after said threshold voltage recovering operation is carried out; and g) determining said nonvolatile semiconductor memory device as a defective device when at least one of said nonvolatile memory cells is in a non-erase completion state.

21. A method as set forth in claim 20, further comprising a step of h) repeating said steps d) to after said nonvolatile semiconductor memory device determined to be a defective device.

22. A method as set forth in claim 21, further comprising a step of repeating said step h) within a definite number of times.

23. A method as set forth in claim 20, further comprising a step of i) repeating said step a) after said flash erase operation is not carried out normally.

24. A method as set forth in claim 23, further comprising a step of repeating said step i) within a definite number of times.

25. A method for erasing and verifying a nonvolatile semiconductor memory device including nonvolatile memory cells, comprising the steps of:

a) performing a write operation upon a certain number of said nonvolatile memory cells;

b) determining whether or not a threshold voltage of each of said certain number of said nonvolatile memory cells is higher than a first reference voltage after said write operation is carried out;

c) performing a flash erase operation upon said certain number of said nonvolatile memory cells when all threshold voltages of said certain number of said nonvolatile memory cells are higher than said first reference voltage;

d) determining whether or not threshold voltages of said certain number of said nonvolatile memory cells are lower than a second reference voltage after said flash erase operation is carried out;

e) determining whether or not a threshold voltage of each of said nonvolatile memory cells is higher than a third reference voltage when all threshold voltages of said certain number of said nonvolatile memory cells are higher than said second reference voltage;

f) performing a threshold voltage recovering operation upon said certain number of said nonvolatile memory cells until threshold voltages of all of said certain number of said nonvolatile memory cells become higher than said third reference voltage, when at least one of said certain number of said nonvolatile memory cells is determined to be not higher than said third reference voltage;

g) determining whether or not a threshold voltage of each of said certain number of said nonvolatile memory cells is lower than said second reference voltage after said threshold voltage recovering operation is carried out; and h) determining said nonvolatile semiconductor memory device as a defective device when a threshold voltage of at least one of said nonvolatile memory cells is determined to be not lower than said second reference voltage.

26. A method as set forth in claim 25, further comprising the steps of:

i) performing a flash erase operation upon said certain number of said nonvolatile memory cells until all threshold voltages of said certain number of said nonvolatile memory cells become lower than said second reference voltage when a threshold voltage of at least one of said certain number of said nonvolatile memory cells is determined to be not higher than said third reference voltage; and j) repeating said steps f) to h) after said step i) is carried out.

27. A method as set forth in claim 26, further comprising a step of repeating said steps i) and j) within a definite number of times.

28. A method as set forth in claim 25, further comprising a step of k) repeating said step a) when a threshold voltage of at least one of said certain number of said nonvolatile memory cells is not higher than said first reference voltage.

29. A method as set forth in claim 28, further comprising a step of repeating said step k) within a definite number of times.

30. A method as set forth in claim 25, further comprising a step of l) repeating said step c) when a threshold voltage of at least one of said certain number of said nonvolatile memory cell is not lower than said second reference voltage.

31. A method as set forth in claim 30, further comprising a step of repeating said step l) within a definite number of times.

32. A method for erasing and verifying a nonvolatile semiconductor memory device including nonvolatile memory cells, comprising the steps of:

a) performing a flash erase operation upon a certain number of said nonvolatile memory cells;

b) determining whether or not a threshold voltage of said certain number of said nonvolatile memory cells is lower than a second reference voltage after said flash erase operation is carried out;

c) determining whether or not a threshold voltage of each of said nonvolatile memory cells is lower than a third reference voltage when all of threshold voltages of said certain number of said nonvolatile memory cells are lower than said second reference voltage;

d) performing a flash erase operation upon said certain number of said nonvolatile memory cells, until all threshold voltages of said certain number of said nonvolatile memory cells becomes lower than said second reference voltage when a threshold voltage of at least one of said certain number of said nonvolatile memory cells is determined to be lower than said third reference voltage; and e) performing a threshold voltage recovering operation upon said certain number of said nonvolatile memory cells until threshold voltages of all of said certain number of said nonvolatile memory cells become higher than said third reference voltage, after said flash erase operation in step d) is carried out;

f) determining whether or not a threshold voltage of each of said certain number of said nonvolatile memory cells is lower than said second reference voltage after said threshold voltage recovering operation is carried out; and g) determining said nonvolatile semiconductor memory device as a defective device when a threshold voltage of at least one of said nonvolatile memory cells is determined to be not lower than said second reference voltage.

33. A method as set forth in claim 32, further comprising a step of h) repeating said steps d) to g) after said nonvolatile semiconductor memory device determined to be a defective device is.

34. A method as set forth in claim 33, further comprising a step of repeating said step h) within a definite number of times.

35. A method as set forth in claim 32, further comprising a step of i) repeating said step c) when a threshold voltage of at least one of said certain number of said nonvolatile memory cell is not lower than said second reference voltage.

36. A method as set forth in claim 35, further comprising a step of repeating said step i) within a definite number of times.

* * * * *